US010615575B2

(12) United States Patent
Liang et al.

(10) Patent No.: US 10,615,575 B2
(45) Date of Patent: Apr. 7, 2020

(54) LIGHT SOURCE AND METHOD FOR CONTROLLING THE SAME

(71) Applicant: Nanyang Technological University, Singapore (SG)

(72) Inventors: Guozhen Liang, Singapore (SG); Qijie Wang, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 15/801,598

(22) Filed: Nov. 2, 2017

(65) Prior Publication Data
US 2018/0138661 A1 May 17, 2018

(30) Foreign Application Priority Data

Nov. 17, 2016 (SG) .......................... 10201609650V

(51) Int. Cl.
*H01S 5/34* (2006.01)
*H01S 5/062* (2006.01)
(Continued)

(52) U.S. Cl.
CPC .......... *H01S 5/3401* (2013.01); *G02F 1/0136* (2013.01); *H01S 5/0092* (2013.01);
(Continued)

(58) Field of Classification Search
CPC .. H01S 5/5036; H01S 5/3404; H01S 5/06236; H01S 2301/14–145; H01S 5/12;
(Continued)

(56) References Cited

U.S. PATENT DOCUMENTS 5,223,972 A * 6/1993 Nishimura ............ H01S 5/5009
359/337
5,497,390 A * 3/1996 Tanaka ................... B82Y 20/00
372/27
(Continued)

FOREIGN PATENT DOCUMENTS

FR 2949024 A1 * 2/2011 ............. B82Y 20/00

OTHER PUBLICATIONS

Hoffman et al., "Coherence in Y-Coupled Quantum Cascade Lasers", 2007, Appl. Phys. Lett. 91, 161106. (Year: 2007).*
(Continued)

*Primary Examiner* — Joshua King
(74) *Attorney, Agent, or Firm* — Kilpatrick Townsend & Stockton LLP

(57) ABSTRACT

Embodiments provide a light source having a coherent light generator arrangement configured to generate at least one output light, and a waveguide arrangement optically coupled to the coherent light generator arrangement, the waveguide arrangement including at least one first resonator element and at least one second resonator element arranged in different orientations, wherein the waveguide arrangement is configured to interact with the at least one output light to cause the at least one first resonator element and the at least one second resonator element to emit respective first and second optical signals to co-operatively interact with each other to generate an output optical signal, and wherein the light source is configured to change a polarization characteristic of the output optical signal in response to at least one electrical signal applied to the light source to vary at least one of respective magnitudes of the first and second optical signals relative to each other.

20 Claims, 15 Drawing Sheets

(51) Int. Cl.
| | |
|---|---|
| *H01S 5/40* | (2006.01) |
| *H01S 5/026* | (2006.01) |
| *H01S 5/00* | (2006.01) |
| *H01S 5/12* | (2006.01) |
| *H01S 5/10* | (2006.01) |
| *G02F 1/01* | (2006.01) |

(52) U.S. Cl.
CPC .......... *H01S 5/026* (2013.01); *H01S 5/06236* (2013.01); *H01S 5/3404* (2013.01); *H01S 5/4087* (2013.01); *H01S 5/005* (2013.01); *H01S 5/0071* (2013.01); *H01S 5/101* (2013.01); *H01S 5/1014* (2013.01); *H01S 5/1021* (2013.01); *H01S 5/12* (2013.01); *H01S 5/1237* (2013.01)

(58) Field of Classification Search
CPC . H01S 5/125; H01S 5/18; H01S 5/187; H01S 5/1046; H01S 5/105; H01S 5/1025; H01S 5/1028; H01S 5/1032; H01S 5/101; H01S 5/3401; H01S 5/3402; H01S 5/1014; H01S 5/1064; H01S 5/1237; H01S 5/1003–1017; H01S 5/1021; H01S 5/4012; H01S 5/4068; H01S 5/4037; H01S 5/4056; G02F 1/0136; G02F 2001/0142; G02F 2001/0144
See application file for complete search history.

(56) References Cited

U.S. PATENT DOCUMENTS

| | | | | |
|---|---|---|---|---|
| 5,602,863 A * | 2/1997 | Itagaki | .................. | G02B 6/4249 257/82 |
| 5,619,325 A | 4/1997 | Yoshida | | |
| 5,784,399 A * | 7/1998 | Sun | ................. | B82Y 20/00 257/14 |
| 5,901,166 A * | 5/1999 | Nitta | ....................... | B82Y 20/00 372/27 |
| 6,043,104 A * | 3/2000 | Uchida | .................. | B82Y 20/00 257/94 |
| 8,213,476 B1 * | 7/2012 | Wanke | .................... | B82Y 20/00 372/43.01 |
| 2006/0146409 A1 | 7/2006 | Yanson | .................. | B82Y 20/00 359/566 |
| 2008/0240645 A1 * | 10/2008 | Funabashi | .......... | G02B 6/12004 385/14 |
| 2010/0046562 A1 * | 2/2010 | Donegan | ............... | H01S 5/0265 372/20 |
| 2010/0226134 A1 * | 9/2010 | Capasso | .................. | B82Y 20/00 362/311.02 |
| 2011/0142085 A1 * | 6/2011 | Yousefi | .................. | H01S 5/0622 372/20 |
| 2011/0315898 A1 * | 12/2011 | Capasso | .................. | B82Y 20/00 250/492.1 |
| 2014/0078580 A1 * | 3/2014 | Hasegawa | ............. | H01S 5/5036 359/344 |
| 2014/0079082 A1 * | 3/2014 | Feng | ....................... | H01S 5/101 372/20 |
| 2017/0163000 A1 * | 6/2017 | Evans | ................. | G02B 6/12004 |
| 2017/0184787 A1 * | 6/2017 | D'Agostino | .......... | G02B 6/2813 |
| 2017/0207603 A1 * | 7/2017 | Evans | .................... | H01S 5/0085 |

OTHER PUBLICATIONS

Marshall et al., "Reversible Mode Switching in Y-Coupled Terahertz Lasers", 2013, Appl. Phys. Lett. 102, 111105. (Year: 2013).*
Kao et al., "Phase-Locked Arrays of Surface-Emitting Terahertz Quantum-Cascade Lasers", 2010, OSA, CLEO, QELS, 1-2. (Year: 2010).*
Kao et al., "Phase-Locked Arrays of Surface-Emitting Terahertz Quantum-Cascade Lasers", 2010, Appl. Phys. Lett., 96, 101106. (Year: 2010).*
RP Photonics, "Quantum Cascade Lasers", Jun. 18, 2015, Way Back Machine, www.rp-photonics.com/quantum_cascade_lasers.html. (Year: 2015).*
Hofstetter et al., "Surface-emitting 10.1 μm quantum-cascade distributed feedback lasers," Appl. Phys. Lett. 75, 3769 (1999). (Year: 1999).*
Bahriz et al., "InAs/AlSb Quantum Cascade Lasers Operating near 20 μm," 2013, Electron. Lett. 49(19), 1238-1240. (Year: 2013).*
"Dielectric", Dec. 16, 2011, Encyclopaedia Britannica, Accessed Oct. 25, 2019. (Year: 2011).*
Barwicz et al. "Polarization-transparent microphotonic devices in the strong confinement limit"; Nat Photonics 2007; 1:57-60.
Fukuda, et al.; "Silicon photonic circuit with polarization diversity"; Opt Express 2008; 16: 4872-4880.
Dong, et al; "Monolithic polarization diversity coherent receiver based on 120-degree optical hybrids on silicon"; Opt Express 2014; 22: 2119-2125.
Roberts, et al.; "Performance of dual-polarization QPSK for optical transport systems"; J Light Technol 2009; 27: 3546-3559.
Optical Internetworking Forum (OIF); "100G Ultra Long Haul DWDM Framework Document"; Doc OIF-FD-100G-DWDM-010 (Jun. 2009): http://www.oiforum.com/public/impagreements.html.
Whitmore.; "Protein secondary structure analyses from circular dichroism spectroscopy: Methods and reference databases"; Biopolymers 2007; 89: 392-400.
Tang, et al; "Enhanced enantioselectivity in excitation of chiral molecules by superchiral light"; Science 2011; 332: 333-336.
Zheng, et al.; "Metasurface holograms reaching 80% efficiency"; Nat Nanotechnol 2015; 10: 308-312.
Tydexoptics; "THz Broad-band Phase Transformers"; 2015; retrieved from http://www.tydexoptics.com/products/thz_optics/thz_converters/.
Holub, et al.; "Electrical spin injection and threshold reduction in a semiconductor laser"; Phys Rev Lett 2007; 98: 1-4.
Jiang, et al.; "Highly spin-polarized room-temperature tunnel injector for semiconductor spintronics using MgO(100)"; Phys Rev Lett 2005; 94: 1-4.
Rauter, et al.; "Electrically pumped semiconductor laser with monolithic control of circular polarization"; Proc Natl Acad Sci 2014; 111: E5623-E5632.
Yu, et al; "Semiconductor lasers with integrated plasmonic polarizers"; Appl Phys Lett 2009; 94: 3-5.
Kohler, et al.; "Terahertz semiconductor-heterostructure laser"; Nature 2002; 417: 156-159.
Liang, et al.; "Single-mode surface-emitting concentric-circular-grating terahertz quantum cascade lasers"; Appl Phys Lett 2013; 102: 031119.
Kumar; "Recent Progress in Terahertz Quantum Cascade Lasers"; IEEE J Sel Top Quantum Electron 2011; 17: 38-47.
Federici, et al.; "THz imaging and sensing for security applications—explosives, weapons and drugs"; Semicond Sci Technol 2005; 20: S266-S280.
Ren, et al.; "High-resolution heterodyne spectroscopy using a tunable quantum cascade laser around 3.5 THz"; Appl Phys Lett 2011; 98: 231109.
Chan, et al.; "Imaging with terahertz radiation"; Reports Prog Phys 2007; 70: 1325-1379.
Kim, et al.; "Biomedical terahertz imaging with a quantum cascade laser"; Appl Phys Lett 2006; 88: 153903.
Lee, et al.; "Real-time terahertz imaging over a standoff distance (>25 meters)"; Appl Phys Lett 2006; 89: 4-7.
Nguyen, et al.; "Three-dimensional imaging with a terahertz quantum cascade laser"; Opt Express 2006; 14: 2123-9.
Yu, et al.; "Light Propagation with Phase Discontinuities: Generalized Laws of Reflection and Refraction"; Science 2011; 334: 333-337.
Ni, et al.; "Broadband Light Bending with Plasmonic Nanoantennas"; Science 2012; 335: 427-427.
Yu, et al.; "Flat optics with designer metasurfaces"; Nat Mater 2014; 13: 139-50.
Ebbesen, et al.; "Surface-plasmon circuitry"; Phys Today 2008; 61: 44-50.

(56) References Cited

OTHER PUBLICATIONS

Ng, et al.; "Spoof Plasmon Surfaces: A Novel Platform for THz Sensing"; Adv Opt Mater 2013; 1: 543-548.
Luo, et al.; "Surface plasmon resonant interference nanolithography technique"; Appl Phys Lett 2004; 84: 4780.
Yu, et al.; "Beam engineering of quantum cascade lasers"; Laser Photonics Rev 2012; 6: 24-46.
Liang, et al.; "Planar integrated metasurfaces for highly-collimated terahertz quantum cascade lasers"; Sci Rep 2014; 4: 1-7.
Williams, et al.; "Highly confined guiding of terahertz surface plasmon polaritons on structured metal surfaces"; Nat Photonics 2008; 2: 175-179.
Pendry, et al.; "Extremely low frequency plasmons in metallic mesostructures"; Phys Rev Lett 1996; 76: 4773-4776.
Navarro-Cia, et al.; "Broadband spoof plasmons and subwavelength electromagnetic energy confinement on ultrathin metafilms"; Opt Express 2009; 17: 18184-95.
Garcia-Vidal, et al.; "Surfaces with holes in them: New plasmonic metamaterials"; J Opt A Pure Appl Opt 2005; 7: S97-S101.
Belkin, et al.; "Terahertz quantum cascade lasers with copper metal-metal waveguides operating up to 178 K"; Opt Express 2008; 16: 3242-3248.
Kohen, et al.; "Electromagnetic modeling of terahertz quantum cascade laser waveguides and resonators"; J Appl Phys 2005; 97: 053106.
Yasuda, et al.; "Measurement of terahertz refractive index of metal with terahertz time-domain spectroscopy"; Jpn J Appl Phys 2008; 47: 1632-1634.
Lin, et al.; "Polarization-Controlled Tunable Directional Coupling of Surface Plasmon Polaritons"; Science 2013; 340: 331-334.
Kao, et al.; "Phase-locked arrays of surface-emitting terahertz quantum-cascade lasers"; Appl Phys Lett 2010; 96: 101106.
Halioua, et al.; "Phase-locked arrays of surface-emitting graded-photonic-heterostructure terahertz semiconductor lasers"; Opt Express 2015; 23: 6915-6923.
Chen, et al.; "Mutual Injection-Locking and Coherent Combining of Two Individual Fiber Lasers"; IEEE J Quantum Electron 2008; 44: 515-519.
Kurtz, et al.; "Mutual Injection Locking: A New Architecture for High-Power Solid-State Laser Arrays"; IEEE J Sel Top Quantum Electron 2005; 11: 578-585.
Hofling, et al.; "Widely tunable single-mode quantum cascade lasers with two monolithically coupled Fabry-Pérot cavities"; Appl Phys Lett 2006; 89: 241126.
Kundu, et al.; "Discrete Vernier tuning in terahertz quantum cascade lasers using coupled cavities"; Opt Express 2014; 22: 16595-16605.
Mahler, et al.; "High-performance operation of single-mode terahertz quantum cascade lasers with metallic gratings"; Appl Phys Lett 2005; 87: 181101.
Williams, et al.; "Distributed-feedback terahertz quantum-cascade lasers with laterally corrugated metal waveguides"; Opt Lett 2005; 30: 2909-2911.
Liang, et al.; "Monolithic Semiconductor Lasers with Dynamically Tunable Linear-to-Circular Polarization"; ACS Photonics 2017, 4, 517-524.
Liang, et al.; "Integrated terahertz optoelectronics"; Proc. SPIE 10030, Infrared, Millimeter-Wave, and Terahertz Technologies IV, 100300T (Dec. 8, 2016).
Liang, et al.; "Recent Developments of Terahertz Quantum Cascade Lasers"; IEEE Journal of Selected Topics in Quantum Electronics, vol. 23, No. 4, Jul./Aug. 2017.
Jahani, et al. "All-dielectric metamaterials", article in Nature Nanotechnology, published online Jan. 7, 2016, DOI:10.1038/NNANO. 2015.304, vol. 11, retrieved from https://www.researchgate.net/publication/289521230_All-dielectric_metamaterials, all pages.
Schuller, et al. "Dielectric Metamaterials Based on Electric and Magnetic Resonances of Silicon Carbide Particles", published Sep. 7, 2007, The American Physical Society, Physical Review Letters, DOI: 10.1103/PhysRevLett.99.107401, PACS Nos. 78.20.Ci, 42.25. Bs, 71.36.+c, 78.30.-j, all pages.
Tredicucci, et al. "Surface plasmon quantum cascade lasers at λ~19μm", vol. 77, 2286 (2000), Issue 15, Submitted Jul. 10. 2000, Accepted Aug. 14, 2000, Published Online Oct. 3. 2000, American Institute of Physics, Applied Physics Letters, retrieved from https://aip.scitation.org/doi/10.1063/1.1316768, all pages.
Fan, et al. "Surface emitting terahertz quantum cascade laser with a double-metal waveguide", published Nov. 27, 2006, vol. 14, No. 24, Optical Society of America, OSA Publishing, Optics Express 11672-11680, retrieved from https://www.osapublishing.org/oe/abstract.cfm?uri=oe-14-24-11672, all pages.
Bahriz, et al. "High temperature operation of far infrared (λ ≈ 20 μm) InAs/AlSb quantum cascade lasers with dielectric waveguide", Published Jan. 26, 2015, vol. 23, No. 2, DOI:10.1364/OE.23. 001523, Optical Society of America, OSA Publishing, Optics Express 1523-1528, retrieved from https://www.osapublishing.org/oe/abstract.cfm?uri=oe-23-2-1523, all pages.

\* cited by examiner

FIG. 3A
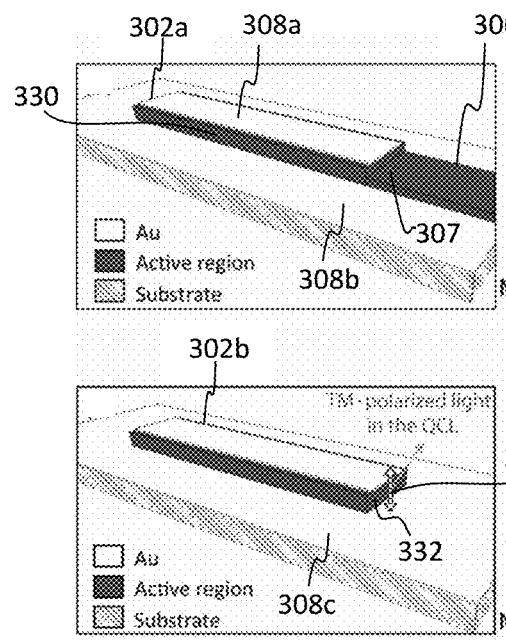
FIG. 3B
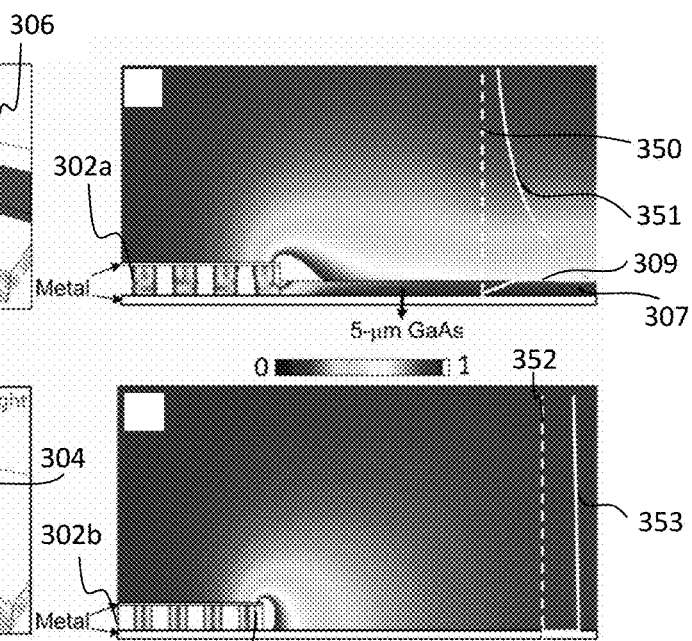
FIG. 3C
FIG. 3D
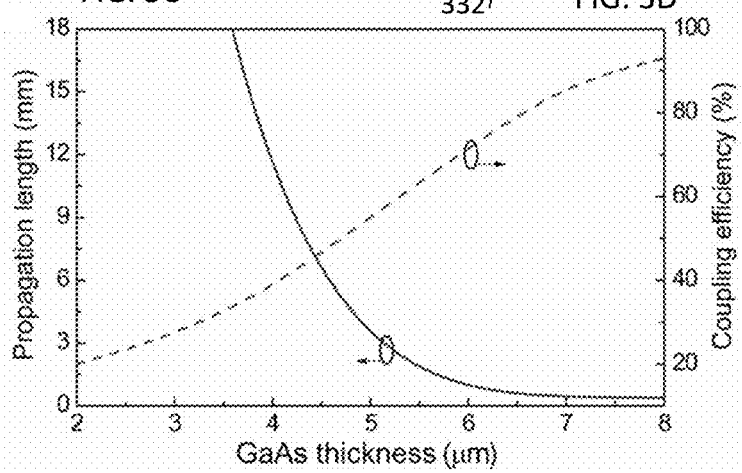
FIG. 3E

FIG. 7A
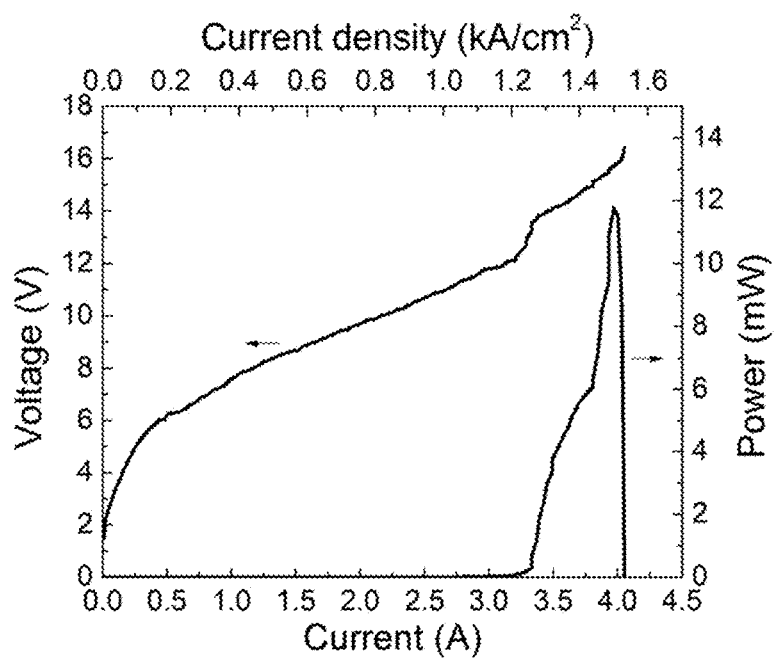
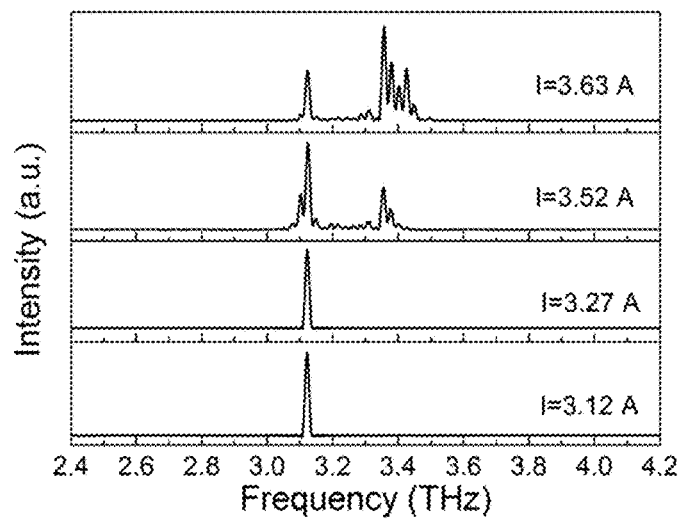
FIG. 7B

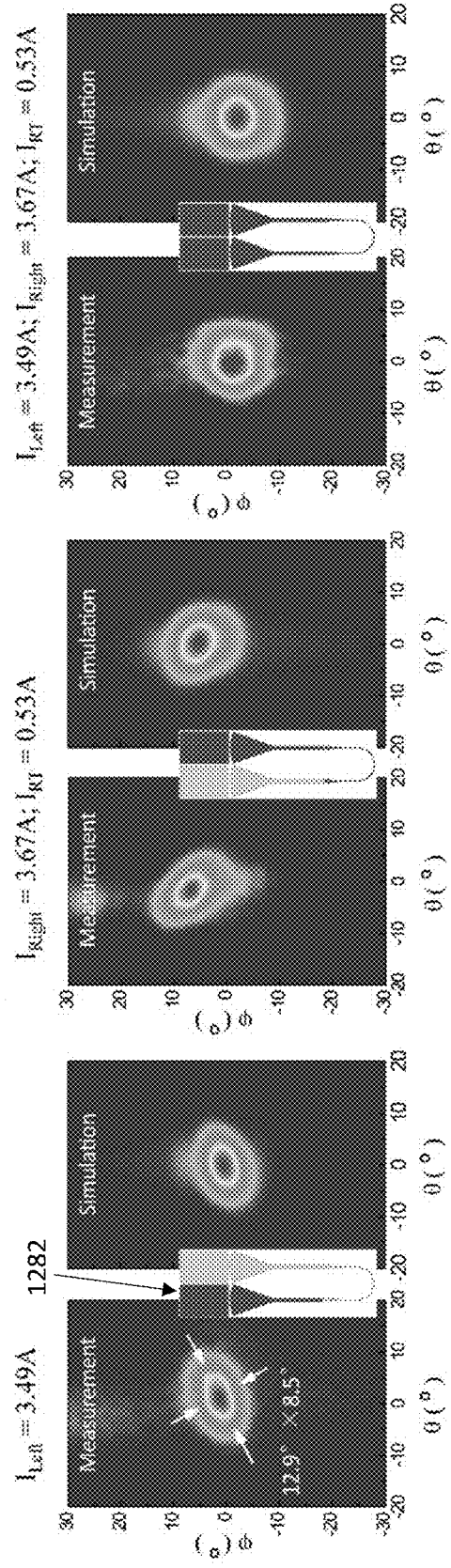
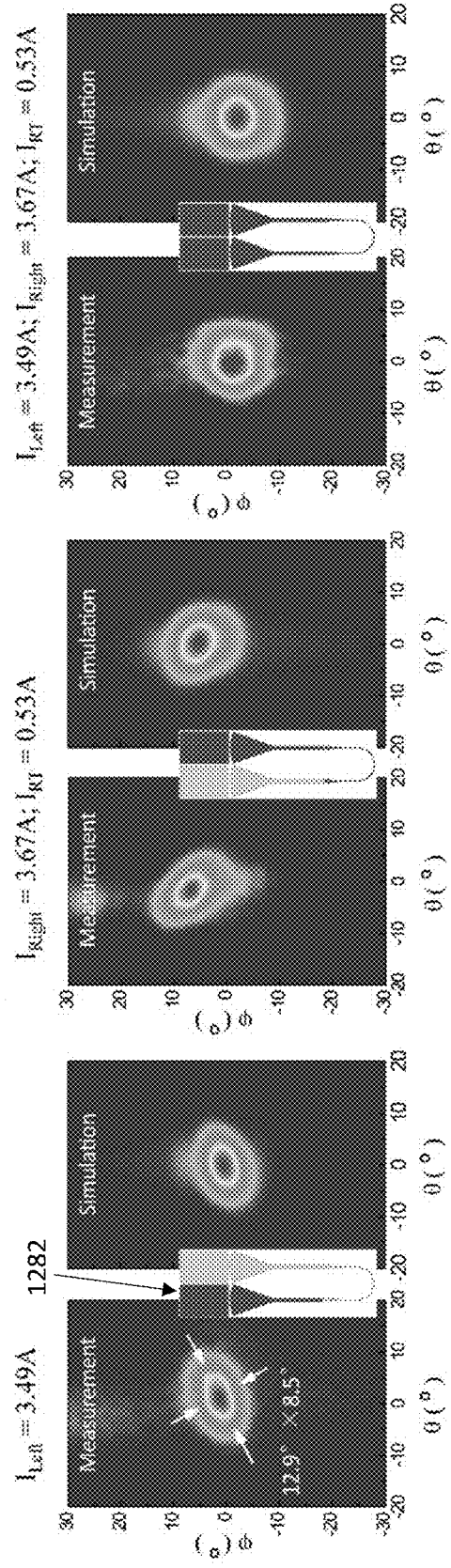
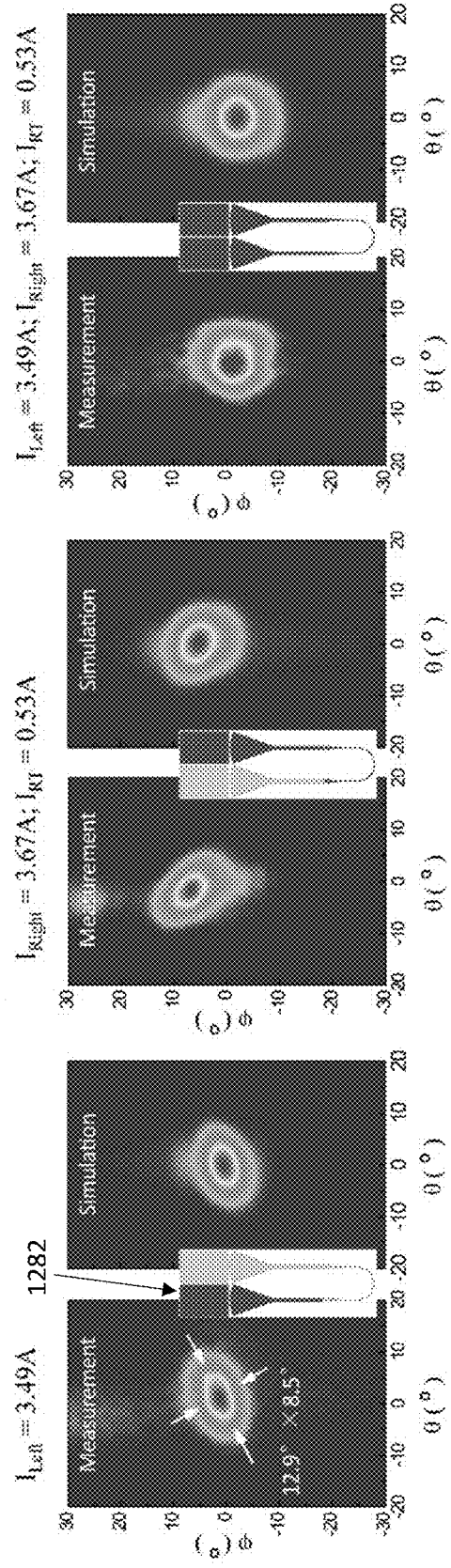
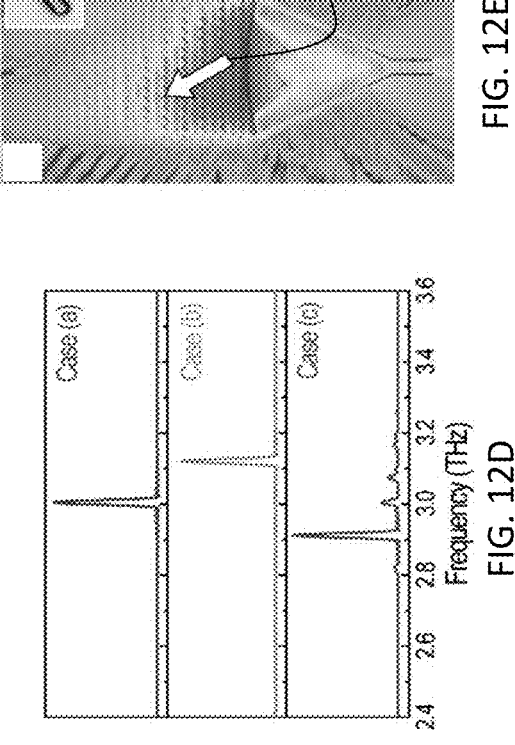
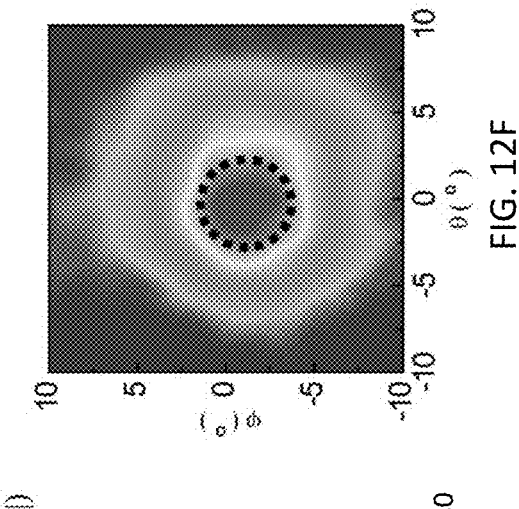
FIG. 12A  FIG. 12B  FIG. 12C  FIG. 12D  FIG. 12E  FIG. 12F

FIG. 12G
DFB grating (openings on metal) on top surface.
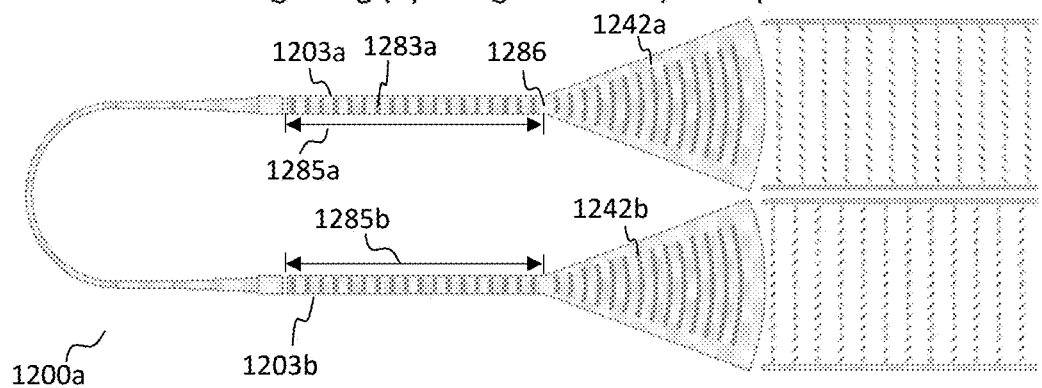
DFB grating at the sides of the ridge segments.
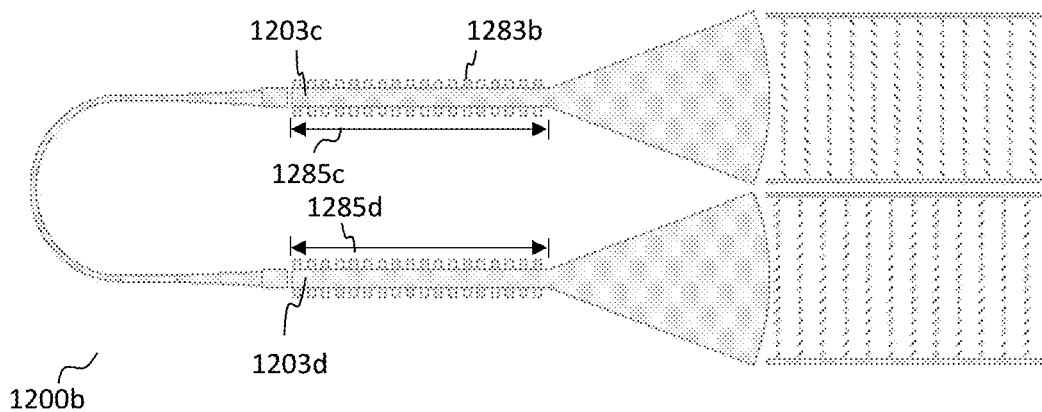
FIG. 12H FIG. 14A
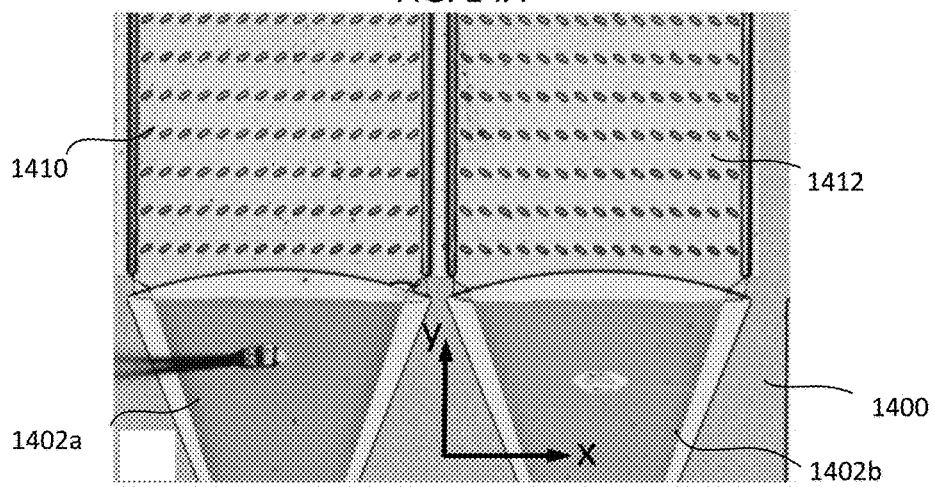
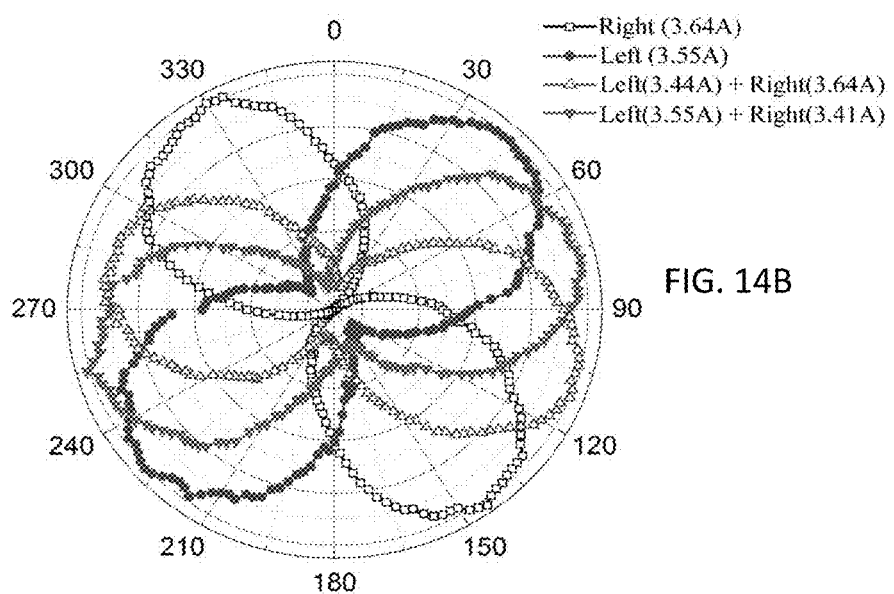
FIG. 14B
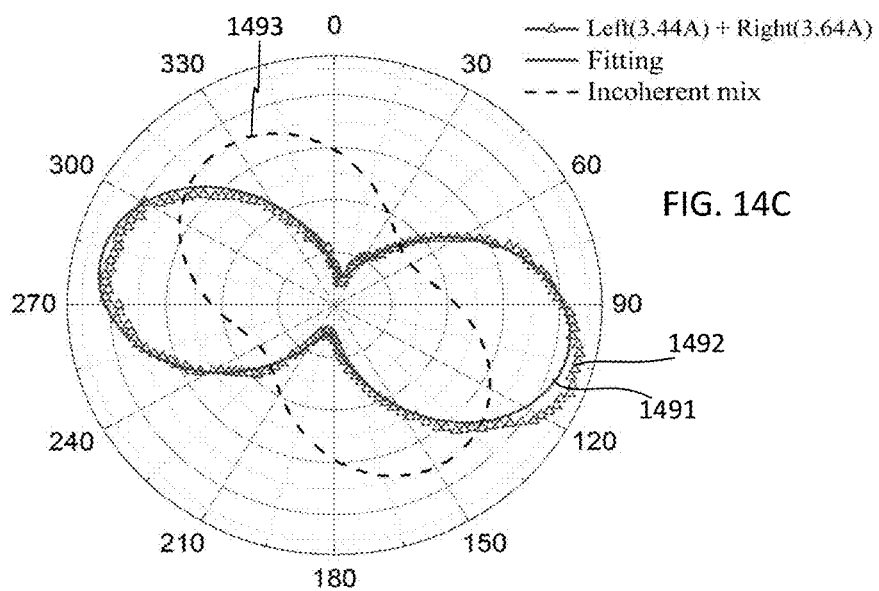
FIG. 14C

LIGHT SOURCE AND METHOD FOR CONTROLLING THE SAME

CROSS-REFERENCE TO RELATED APPLICATION

This application claims the benefit of priority of Singapore patent application No. 10201609650V, filed 17 Nov. 2016, the content of it being hereby incorporated by reference in its entirety for all purposes.

TECHNICAL FIELD

Various embodiments relate to a light source and a method for controlling a light source.

BACKGROUND

The ability to manipulate the polarization states of radiation has a breadth of applications across the electromagnetic spectrum. For example, in communication systems, polarization multiplexing/diversity can significantly improve data reliability and transmission rate, in which there has been proposed a scheme to reach 100 Gb/s per channel over existing infrastructure; in spectroscopy and sensing applications, variable polarization of the light source is an attractive feature for investigating materials with local symmetry, e.g., molecular chirality; in optical holography, circularly polarized beams make it possible to realize wide-angle holograms with 80% power efficiency over a broad wavelength range, upon illuminating metallic nanorod arrays; and, continuously tunable linear-elliptical polarization significantly simplifies the design of ellipsometry systems, by eliminating the use of Soleil-Babinet compensators or rotating analyzers.

Manipulation of the polarization state of light usually relies on external, bulky, optical components, such as wave plates and polarizers. However, these do not lead to system miniaturization and fast operation, and many such components are lossy over specific wavelength ranges (e.g., known terahertz (THz) frequency continuous polarization converters have a transmission <30%). Previously, it has been demonstrated that the polarization state of spin-polarized lasers and light-emitting diodes can be tuned by varying the amplitude or direction of an applied external magnetic field, achieving a degree-of-circular-polarization (DOCP) of up to 50%. Furthermore, a degree-of-circular-polarization (DOCP) of 98% was achieved in quantum cascade lasers (QCLs) with built-in antennas for selected far-field regions of the emission, albeit pre-determined by the device fabrication process.

Further, for known devices, the polarization property is fixed after fabrication.

Therefore, there is a need to develop low loss devices with controllable polarization.

SUMMARY

The invention is defined in the independent claims. Further embodiments of the invention are defined in the dependent claims.

According to an embodiment, a light source is provided. The light source may include a coherent light generator arrangement configured to generate at least one output light, and a waveguide arrangement optically coupled to the coherent light generator arrangement, the waveguide arrangement including at least one first resonator element and at least one second resonator element arranged in different orientations, wherein the waveguide arrangement is configured to interact with the at least one output light to cause the at least one first resonator element and the at least one second resonator element to emit respective first and second optical signals to co-operatively interact with each other to generate an output optical signal, and wherein the light source is configured to change a polarization characteristic of the output optical signal in response to at least one electrical signal applied to the light source to vary at least one of respective magnitudes of the first and second optical signals relative to each other.

According to an embodiment, a method for controlling a light source is provided. The method may include generating at least one output light from a coherent light generator arrangement of the light source for interaction with a waveguide arrangement of the light source to cause at least one first resonator element and at least one second resonator element of the waveguide arrangement arranged in different orientations to emit respective first and second optical signals to co-operatively interact with each other to generate an output optical signal, and applying at least one electrical signal to the light source to vary at least one of respective magnitudes of the first and second optical signals relative to each other to change a polarization characteristic of the output optical signal.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 3A shows a schematic diagram illustrating geometry of a double-metal ridge terahertz (THz) quantum cascade laser (QCL) with an integrated gallium arsenide loaded surface plasmon (SP) waveguide.

FIG. 3B shows a cross-sectional electric field (amplitude) distribution of the double-metal ridge terahertz (THz) quantum cascade laser (QCL) of FIG. 3A.

FIG. 3C shows a schematic diagram illustrating geometry of a double-metal ridge terahertz (THz) quantum cascade laser (QCL) without the integrated gallium arsenide loaded surface plasmon (SP) waveguide.

FIG. 3D shows a cross-sectional electric field (amplitude) distribution of the terahertz (THz) radiation ($\lambda_0$=96 μm) near the quantum cascade laser (QCL) facet of the double-metal ridge terahertz (THz) quantum cascade laser (QCL) of FIG. 3C.

FIG. 3E shows a plot of the calculated propagation length and coupling efficiency of the terahertz (THz) radiation into the gallium arsenide-loaded surface plasmon (SP) waveguide as a function of the gallium arsenide (GaAs) thickness.

FIG. 7A shows a plot of the light-current-voltage characterization of a right hand quantum cascade laser (QCL) at 10 Kelvin (K), and FIG. 7B shows spectra of a light source with increasing current.

FIGS. 12A to 12F show results of far-field investigation of a phase-locked light source.

FIG. 12G shows distributed feedback (DFB) gratings incorporated on the top surface of the ridges of the lasers of the light source of various embodiments.

FIG. 12H shows distributed feedback (DFB) gratings incorporated at the sides of the ridges of the lasers of the light source of various embodiments.

FIG. 14A shows an optical microscope image of part of a fabricated phase-locked light source without any phase shift.

FIG. 14B plots the measured polarization states of the light source of FIG. 14A.

FIG. 14C plots the measured polarization states of the radiation from two antenna arrays.

DETAILED DESCRIPTION

Figure 1A:
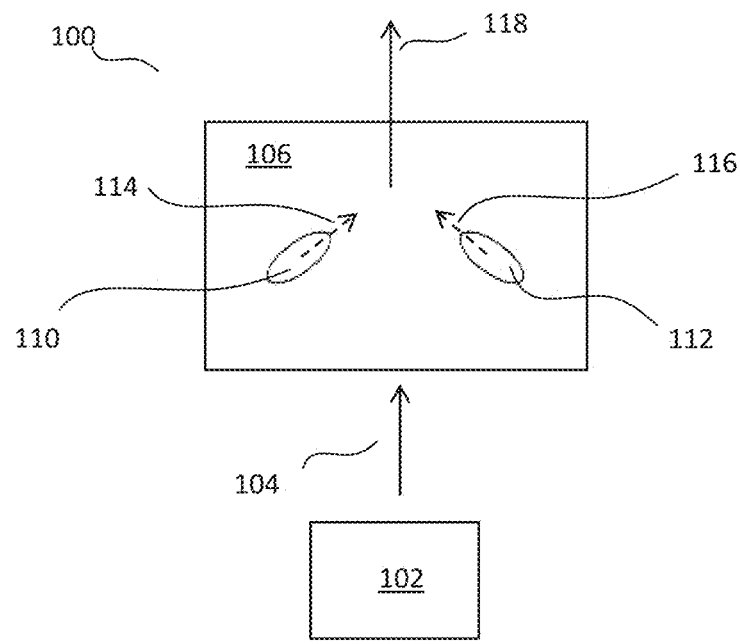
FIG. 1A shows a schematic diagram of a light source, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

It should be appreciated that polarization may be a consideration for any light source. The ability to control the polarization state of emission from lasers (e.g., semiconductor lasers) may be useful for many applications in spectroscopy, imaging, and communications, inter alia, with monolithic integration approaches being advantageous. Although manipulating the output polarization of radiation from a laser may be achieved through a number of approaches, obtaining continuous dynamic control, e.g., from linear to circular, remains challenging.

Various embodiments may provide low loss, monolithic devices with controllable polarization.

Various embodiments may provide monolithic light sources (e.g., having semiconductor lasers) with dynamically tunable polarization characteristic (e.g., dynamically tunable linear-to-circular polarization).

Various embodiments may provide a light source (e.g., having quantum cascade laser (QCL)) with electrically and dynamically tunable polarization state.

Various embodiments may provide monolithic light sources in which electronic tuning may lead to a widely and dynamically tunable polarization state, and/or a high degree-of-circular-polarization (DOCP).

Various embodiments may be employed or operable in the terahertz (THz) frequency region of the electromagnetic spectrum. It should be appreciated that the terahertz (THz) frequency region (~0.3 terahertz (THz) to 10 terahertz (THz)) may have potential for a number of diverse applications ranging from non-destructive imaging and spectroscopic sensing, through to ultra-high bit rate wireless communication.

Various embodiments may employ terahertz (THz) frequency quantum cascade lasers (QCLs).

The development of devices such as the quantum cascade laser (QCL) has brought terahertz (THz) technologies closer to more widespread applications. In the context of various embodiments, electrically pumped, semiconductor-based terahertz (THz) sources may be employed, suitable for many diverse applications, including spectroscopic sensing and non-invasive detection.

In various embodiments, two quantum cascade lasers (QCLs) may be phase-locked, for example, with cross-polarized beams that may have a phase shift of ~π/2. The intensity of each beam may be controlled relatively independently, enabling the polarization of the overlapping beam to be tuned continuously from linear to near-circular.

Various embodiments may employ a gallium arsenide-, or silicon-, or indium phosphide-loaded terahertz (THz) surface plasmon (SP) waveguide which may provide a flexible platform for terahertz (THz) quantum cascade laser (QCL) beam manipulation.

In various embodiments, to control the polarization of the beam, a metallic subwavelength scattering antenna array, a so-called metasurface, may be integrated onto the surface plasmon (SP) waveguide.

In various embodiments, the metasurfaces (e.g., metal antenna arrays) may act as efficient beam collimators, yielding a small collimated beam divergence of ~10°×10°.

Various embodiments may provide that the polarization of terahertz (THz) frequency radiation may be continuously tuned electronically from linear to circular polarization by monolithically integrating in-plane metasurfaces with two phase-locked semiconductor-based terahertz (THz) quantum cascade lasers (QCLs).

Various embodiments may have broad applicability to a wide range of semiconductor lasers operating from the visible to terahertz (THz) regions of the electromagnetic spectrum.

It should be appreciated that elliptically or circularly polarized light may be treated as the superposition of two orthogonally polarized components with a π/2 phase difference. In various embodiments, the amplitude of each component may be tuned independently, where the polarization of the resultant field may evolve continuously from linear to circular polarization.

FIG. 1A shows a schematic diagram of a light source 100, according to various embodiments. The light source 100 includes a coherent light generator arrangement 102 configured to generate at least one output light (represented by arrow 104), and a waveguide arrangement 106 optically coupled to the coherent light generator arrangement 102, the waveguide arrangement 106 including at least one first resonator element 110 and at least one second resonator element 112 arranged in different orientations, wherein the waveguide arrangement 106 is configured to interact with the at least one output light 104 to cause the at least one first resonator element 110 and the at least one second resonator element 112 to emit respective first and second optical signals (respectively represented by dashed arrows 114, 116) to co-operatively interact with each other to generate an output optical signal (represented by arrow 118), and wherein the light source 100 is configured to change a polarization characteristic of the output optical signal 118 in response to at least one electrical signal applied to the light source 100 to vary at least one of respective magnitudes of the first and second optical signals 114, 116 relative to each other.

In other words, a light source 100 may be provided. The light source 100 may include a light generator arrangement 102 which may generate one or more coherent output lights 104. The coherent light generator arrangement 102 may include at least one resonating region (or cavity) having an active region for generating the at least one output light 104. The active region may be sandwiched between two reflectors (or reflecting elements).

The light source 100 may further include a waveguide arrangement 106 optically coupled to the coherent light generator arrangement 102. The (optical) waveguide arrangement 106 may include at least one (optical) waveguide portion or structure. The waveguide arrangement 106 may receive at least a portion of the at least one output light 104, e.g., a (smaller) portion of the output light 104 or the entire output light 104. In various embodiments, the at least one output light 104 may propagate through or within the waveguide arrangement 106.

The waveguide arrangement 106 may include at least one first resonator element (e.g., first (optical) antenna element) 110 and at least one second resonator element (e.g., second (optical) antenna element) 112 arranged in (or along) different orientations (or directions). This may mean that the at least one first resonator element 110 may be arranged in or along a first orientation, while the at least one second resonator element 112 may be arranged in or along a second orientation, where the first and second orientations are different to each other. While FIG. 1A illustrates the at least one first resonator element 110 and the at least one second resonator element 112 being arranged in a specific orientation, individually, and relative to each other, it should be appreciated that each of the at least one first resonator element 110 and the at least one second resonator element 112 may be arranged in any other orientation, individually, and/or relative to each other. In various embodiments, the at least one first resonator element 110 and at least one second resonator element 112 may be arranged along different axes to define the orientations of the at least one first resonator element 110 and at least one second resonator element 112, where an angle may be defined between the different axes, for example, between 1° and 90°.

The waveguide arrangement 106 may interact with the at least one output light 104 to cause the at least one first resonator element 110 to emit a first optical signal (e.g., light) 114 and to cause the at least one second resonator element 112 to emit a second optical signal (e.g., light) 116. As a non-limiting example, the interaction of the waveguide arrangement 106 with the at least one output light 104 may result in an intermediate (optical) signal, and the at least one first resonator element 110 and the at least one second resonator element 112 may interact with the intermediate signal, resulting in the emission of the first optical signal 114 from the at least one first resonator element 110 and the emission of the second optical signal 116 from the at least one second resonator element 112. In various embodiments, the at least one first resonator element 110 and the at least one second resonator element 112 may be or may act as metasurfaces.

In various embodiments, the first optical signal 114 and the second optical signal 116 may co-operatively interact (e.g., in the form of coherent interaction or coherent interference) with each other to generate an effective or combined (coherent) output optical signal (e.g., light) 118. The interaction may occur at near field or far field. The output optical signal 118 may have or may be of a defined polarization (state), meaning that the output optical signal 118 may be polarized. The first and second optical signals 114, 116 may be coherent over a broad area (i.e., coherent broad-area emission from the at least one first resonator element 110 and the at least one second resonator element 112). As a result, the output optical signal 118 may have a narrow beam divergence.

In various embodiments, the light source 100 may be adapted to change a polarization characteristic (or parameter) (e.g., polarization direction angle) of the output optical signal 118. For example, during operation, at least one electrical signal may be applied to the light source 100 to vary at least one of respective magnitudes (or intensities) of the first 114 and second optical signals 116 relative to each other. This means that, as a result of the application of the electrical signal, one or both of the magnitudes of the first 114 and second optical signals 116 (or the magnitude of the associated electric field component of the corresponding optical signal) may be changed such that the respective magnitudes of the first 114 and second optical signals 116 may be different to each other. Such a change in the respective magnitudes (where there is a difference between the magnitudes) may cause a change in the polarization characteristic of the output optical signal 118. As such, it should be appreciated that the polarization characteristic of the output optical signal 118 may be varied by way of electrical tuning, which may enable dynamic tuning and/or faster tuning compared to other techniques.

In various embodiments, the at least one output light 104 may be split into two portions for interaction with the waveguide arrangement 106 for causing the at least one first resonator element 110 and the at least one second resonator element 112 to respectively emit the first optical signal 114 and the second optical signal 116.

In various embodiments, for emitting the first and second optical signals 114, 116 as the output signals, the at least one first resonator element 110 and the at least one second resonator element 112 may receive respective input (optical or electromagnetic) signals based on or derived from the at least one output light 104 interacting with the waveguide arrangement 106. The respective input signals may be the same input signal (i.e., single input signal) or may be respective distinct input signals.

In the context of various embodiments, the first and second optical signals 114, 116 may be linearly polarised. As a non-limiting example, the first and second optical signals 114, 116 may be linearly polarised, and the output optical signal 118 may be linearly polarised, and, as a result of the application of the at least one electrical signal, the angle or orientation associated with the linear polarization of the output optical signal 118 may be changed. In other words, the axis associated with the linear polarisation may be changeable or rotatable. As a further non-limiting example where there may be a phase shift between the first and second optical signals 114, 116, the first and second optical signals 114, 116 may be linearly polarised, and the output optical signal 118 may be circularly or elliptically polarised, and, as a result of the application of the at least one electrical signal, the angle or orientation associated with the circular polarization or elliptical polarisation of the output optical signal 118 may be changed.

It should be appreciated that the directions illustrated for the arrows 104, 114, 116, 118 respectively representing the output light 104, first optical signal 114, second optical signal 116, and output optical signal 118 are for illustrative purposes and are non-limiting examples. Further, it should be appreciated that the directions of the arrows 104, 114, 116, 118 may be different, individually and/or relative to each other, meaning that the propagation of the output light 104, the first optical signal 114, the second optical signal 116, and the output optical signal 118 may be different than those illustrated in FIG. 1A, depending on the arrangement or configuration of the corresponding features or components of the light source 100.

In various embodiments, the coherent light generator arrangement 102 may include a semiconductor-based light generator arrangement configured to generate the at least one output light 104.

In various embodiments, the coherent light generator arrangement 102 may include a laser arrangement (e.g., a quantum cascade laser (QCL) arrangement with a dielectric material (e.g., in the active region)) configured to generate the at least one output light 104.

In various embodiments, the coherent light generator arrangement 102 may include a laser arrangement (e.g., a quantum cascade laser (QCL) arrangement with at least one of gallium arsenide (GaAs), silicon (Si) or Indium phosphide (InP) (e.g., in the active region)) configured to generate the at least one output light 104.

In various embodiments, at least one of the at least one first resonator element 110 or the at least one second resonator element 112 may be or may function as an oscillator or an antenna (or antenna element).

In various embodiments, the at least one first resonator element 110 and the at least one second resonator element 112 may be arranged cross-oriented to one another, as illustrated in FIG. 1A. This may mean that the at least one first resonator element 110 and the at least one second resonator element 112 may be arranged orthogonal to each other. In such an arrangement, the respective electrical field vectors of the respective first 114 and second 116 optical signals may be at least substantially orthogonal to each other.

In various embodiments, a plurality of first resonator elements may be provided, arranged at least substantially parallel to each other. This may mean that a first resonator array (or antenna array) may be provided.

In various embodiments, a plurality of second resonator elements may be provided, arranged at least substantially parallel to each other. This may mean that a second resonator array (or antenna array) may be provided.

In various embodiments, the light source 100 may include at least one phase shifter element capable of introducing a phase shift between the first optical signal 114 and the second optical signal 116. The at least one phase shifter element may be electrically or thermally or through any other mechanisms tuned to change its refractive index so as to introduce the phase shift. The at least one phase shifter element may include or may be in the form of a film (such as dielectrics or polymers or liquid crystals) or in any other forms (such as grating structures along the light propagation direction or micro/nanostructures) that are capable of introducing the phase shift. In various embodiments, the at least one phase shifter element may be part of the waveguide arrangement 106.

In various embodiments, the phase shift between the first and second optical signals 114, 116 may result in an output optical signal 118 of a defined polarization state. In a non-limiting example, the phase shift between the first and second optical signals 114, 116, may result in an output optical signal 118 that is circularly polarized. In another non-limiting example, the phase shift between the first and second optical signals 114, 116 may result in an output optical signal 118 that is elliptically polarized. It should be appreciated that, where there is no phase shift between the first optical signal 114 and the second optical signal 116, the output optical signal 118 may be linearly polarised.

In various embodiments, the polarization characteristic of the output optical signal 118 may include a polarization direction angle. The polarization direction angle may mean an angle or direction associated with the polarisation. For example, the vector associated with a linear polarization may be along a certain direction, such as along an x-axis, a y-axis, or a direction therebetween.

In the context of various embodiments, the polarization characteristic or polarization direction angle of the output optical signal 118 may be changed from linear polarization in one polarization direction angle to linear polarization in another polarization direction angle in response to the at least one electrical signal applied to the light source 100 to vary at least one of the respective magnitudes of the first 114 and second 116 optical signals relative to each other.

In various embodiments, the coherent light generator arrangement 102 may generate the at least one output light 104 in a region between visible light and terahertz. This may mean that the at least one output light 104 may have a wavelength or wavelength range in a region of the electromagnetic spectrum ranging from the visible light region to the terahertz (THz) region. For example, the at least one output light 104 emitted by the coherent light generator arrangement 102 may have a wavelength of between about 400 nm and about 700 nm.

In various embodiments, the coherent light generator arrangement 102 may include a grating structure. A grating structure is a frequency sensitive element where the coherent light generator arrangement 102 may generate the at least one output light 104 or may lase at a particular wavelength or frequency, depending on the configuration (e.g., period) of the grating structure. In various embodiments, one or more grating structures (e.g., distributed feedback (DFB) grating(s)) may be provided. As non-limiting examples, the grating structure may be defined by openings (or apertures) formed in the coherent light generator arrangement 102 or protrusions extending from the coherent light generator arrangement 102. The arrangement of the openings or protrusions may be periodic.

In various embodiments, the waveguide arrangement 106 may introduce a phase shift between the first 114 and second 116 optical signals.

In various embodiments, the at least one first resonator element 110 and the at least one second resonator element 112 may be arranged offset to one another to introduce the phase shift. For example, the at least one first resonator element 110 and the at least one second resonator element 112 may, relative to each other, be vertically offset or offset in the direction of propagation of the at least one surface (electromagnetic) wave.

In various embodiments, the coherent light generator arrangement 102 may include at least one tapering portion to optically couple the at least one output light 104 to the waveguide arrangement 106. The at least one tapering portion may have a width or dimension increasing in a direction towards the waveguide arrangement 106. The at least one tapering portion may have an arc-shaped facet on its output side. This may mean that the at least one output light 104 may pass through the arc-shaped facet for optical coupling to the waveguide arrangement 106.

In various embodiments, the waveguide arrangement 106 may interact with the at least one output light 104 to generate at least one surface (electromagnetic) wave (propagating on and/or within the waveguide arrangement 106), and the at least one first resonator element 110 and the at least one second resonator element 112 may interact with the at least one surface (electromagnetic) wave to emit the respective first 114 and second 116 optical signals.

In various embodiments, the waveguide arrangement 106 may interact with the at least one output light 104 to generate two surface waves for interaction with the at least one first resonator element 110 and the at least one second resonator element 112 respectively.

In various embodiments, the at least one surface (electromagnetic) wave may be or may include a surface plasmon wave. The surface plasmon wave may oscillate within the at least one first resonator element 110 and the at least one second resonator element 112. As a non-limiting example, the at least one surface (electromagnetic) wave may oscillate and/or resonate within the at least one first resonator element 110 and the at least one second resonator element 112, for example, along respective longitudinal directions or axes, to be emitted as respective first and second optical signals 114, 116. The respective electrical field vectors of the first and second optical signals 114, 116 may be in or along planes along the respective longitudinal directions.

In various embodiments, the thickness of the waveguide arrangement 106 or the corresponding waveguide structure may be suitably tailored for reasonable confinement and propagation loss of the at least one surface wave.

In various embodiments, the coherent light generator arrangement 102 may include an active region, and the waveguide arrangement 106 may include a layer structure extending from the active region. The term "active region" may mean a region of the coherent light generator arrangement 102 where light (e.g., the at least one output light 104) may be generated. At least one grating structure may be defined in the portion of the coherent light generator arrangement 102 with the active region.

In various embodiments, the active region may include a dielectric material. The dielectric material may include at least one of gallium arsenide (GaAs), silicon (Si) or indium phosphide (InP).

In various embodiments, the active region may include at least one of gallium arsenide (GaAs), silicon (Si) or indium phosphide (InP).

In various embodiments, the coherent light generator arrangement 102 may generate two output lights, and the waveguide arrangement 106 may interact with one of the two output lights to cause the at least one first resonator element 110 to emit the first optical signal 114, and may further interact with the other of the two output lights to cause the at least one second resonator element 112 to emit the second optical signal 116. In various embodiments, the coherent light generator arrangement 102 may have two output regions optically coupled to the waveguide arrangement 106, where the two output lights may be emitted respectively though the two output regions. The two output regions may be optically coupled to different portions or regions of the waveguide arrangement 106. The coherent light generator arrangement 102 may include one resonating region or cavity optically coupled to the two output regions. The resonating region may include an active region (e.g., of at least one of GaAs, Si or InP). As a non-limiting example, the coherent light generator arrangement 102 may include a continuous structure or configuration having the two output regions.

In various embodiments, the coherent light generator arrangement 102 may include two resonating regions (or resonating cavities or optical cavities) configured to generate the two output lights respectively and an adjoining waveguide structure arranged to optically couple the two resonating regions to each other for phase locking the two output lights. This may mean that the two resonating regions may be optically coupled to each other via the adjoining waveguide structure. The adjoining waveguide structure may be arranged in between the two resonating regions. The adjoining waveguide structure may be in the form of a half racetrack structure or section. The adjoining waveguide structure may function as a phase locking mechanism, meaning to lock the phases of the respective output lights to each other or maintain a constant phase relationship between the respective output lights. Each of the two resonating regions may include an active region (e.g., of at least one of GaAs, Si or InP). In various embodiments, each of the two resonating regions may include a respective grating structure (e.g., a distributed feedback (DFB) grating).

In various embodiments, the waveguide arrangement 106 may include a first surface portion and a second surface portion. The at least one first resonator element 110 may extend (or protrudes or projects) from (or above) the first surface portion, and the at least one second resonator element 112 may extend (or protrudes or projects) from (or above) the second surface portion. This may mean that each of the at least one first resonator element 110 and the at least one second resonator element 112 may define a pillar or upstanding element (or structure) on the first surface portion and the second surface portion respectively.

In further embodiments, the at least one first resonator element 110 and/or the at least one second resonator element 112 may be in the form of a recess or groove in the waveguide arrangement 106, for example, recessed into the waveguide arrangement 106 relative to the first surface portion and the second surface portion respectively.

In various embodiments, the at least one first resonator element 110 may include an upper (or top) metal portion (or layer) which may be spaced apart from the first surface portion, and the at least one second resonator element 112 may include an upper (or top) metal portion (or layer) which may be spaced apart from the second surface portion.

Figure 1B:
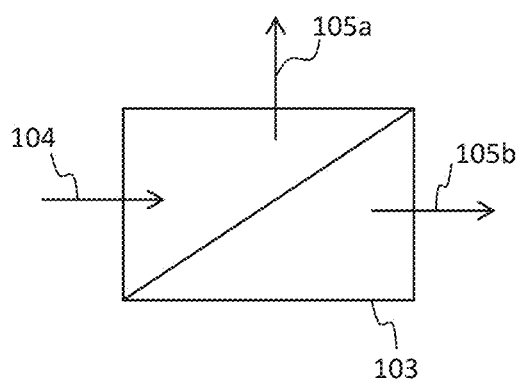
FIG. 1B shows a schematic diagram of a beamsplitter as part of a light source of various embodiments.

In various embodiments, referring to FIG. 1B, the light source 100 may further include a beamsplitter 103 optically coupled to the coherent light generator arrangement 102 and the waveguide arrangement 106. The beamsplitter 103 may be arranged to split the at least one output light 104 into a first output light portion 105a and a second output light portion 105b. As a non-limiting example, the waveguide arrangement 106 may interact with the first output light portion 105a to cause the at least one first resonator element 110 to emit the first optical signal 114, and may further interact with the second output light portion 105b to cause the at least one second resonator element 112 to emit the second optical signal 116. It should be appreciated that the beamsplitter 103 may split the at least one output light 104 into equal or different amounts (or intensities) depending on the design of the beamsplitter 103.

In various embodiments, the beamsplitter 103 may be part of the coherent light generator arrangement 102.

In the context of various embodiments, each of or at least one of the at least one first resonator element 110 or the at least one second resonator element 112 may include any suitable shape, for example, having an elongated shape with a longitudinal axis. As non-limiting examples, the shape may include a rectangle, an ellipse, or a stadium-like shape.

Figure 1C:
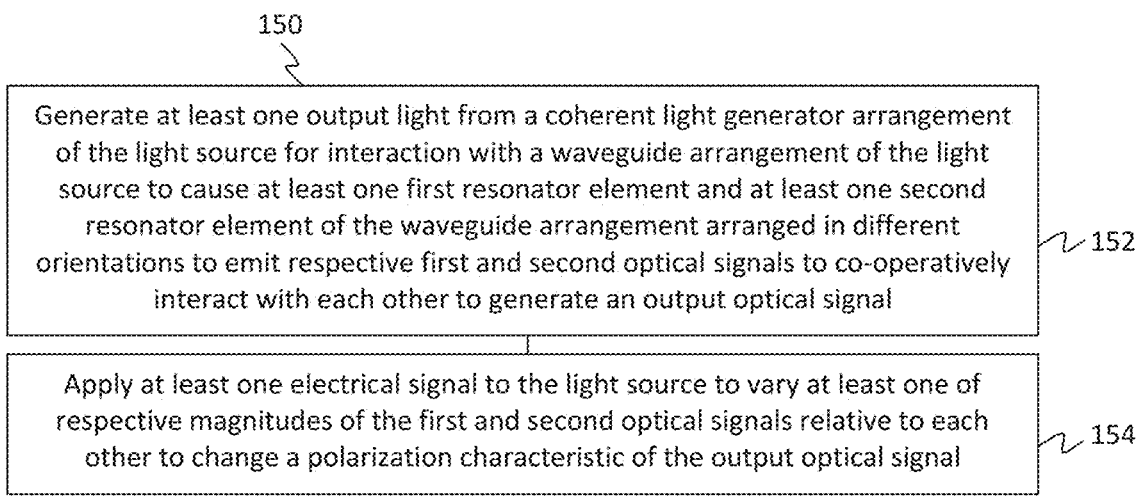
FIG. 1C shows a flow chart illustrating a method for controlling a light source, according to various embodiments.

FIG. 1C shows a flow chart 150 illustrating a method for controlling a light source, according to various embodiments.

At 152, at least one output light is generated from a coherent light generator arrangement of the light source for interaction with a waveguide arrangement of the light source to cause at least one first resonator element and at least one second resonator element of the waveguide arrangement arranged in different orientations to emit respective first and second optical signals to co-operatively interact with each other to generate an output optical signal.

At 154, at least one electrical signal is applied to the light source to vary at least one of respective magnitudes of the first and second optical signals relative to each other to change a polarization characteristic of the output optical signal.

In various embodiments, at 152, two output lights may be generated respectively from two resonating regions of the coherent light generator arrangement, the two resonating regions being optically coupled to each other by an adjoining waveguide structure for phase locking the two output lights, and, at 154, respective electrical signals of different magnitudes may be applied to the two resonating regions.

In various embodiments, the method may further include the step of introducing a phase shift between the first optical signal and the second optical signal.

In the context of various embodiments, the light source (e.g., 100) may be a monolithic light source.

In the context of various embodiments, the coherent light generator arrangement (e.g., 102) and the waveguide arrangement (e.g., 106) may be integrated in the light source (e.g., 100).

It should be appreciated that descriptions in the context of the light source 100 may correspondingly be applicable in relation to the method for controlling a light source described in the context of the flow chart 150.

Figure 2:
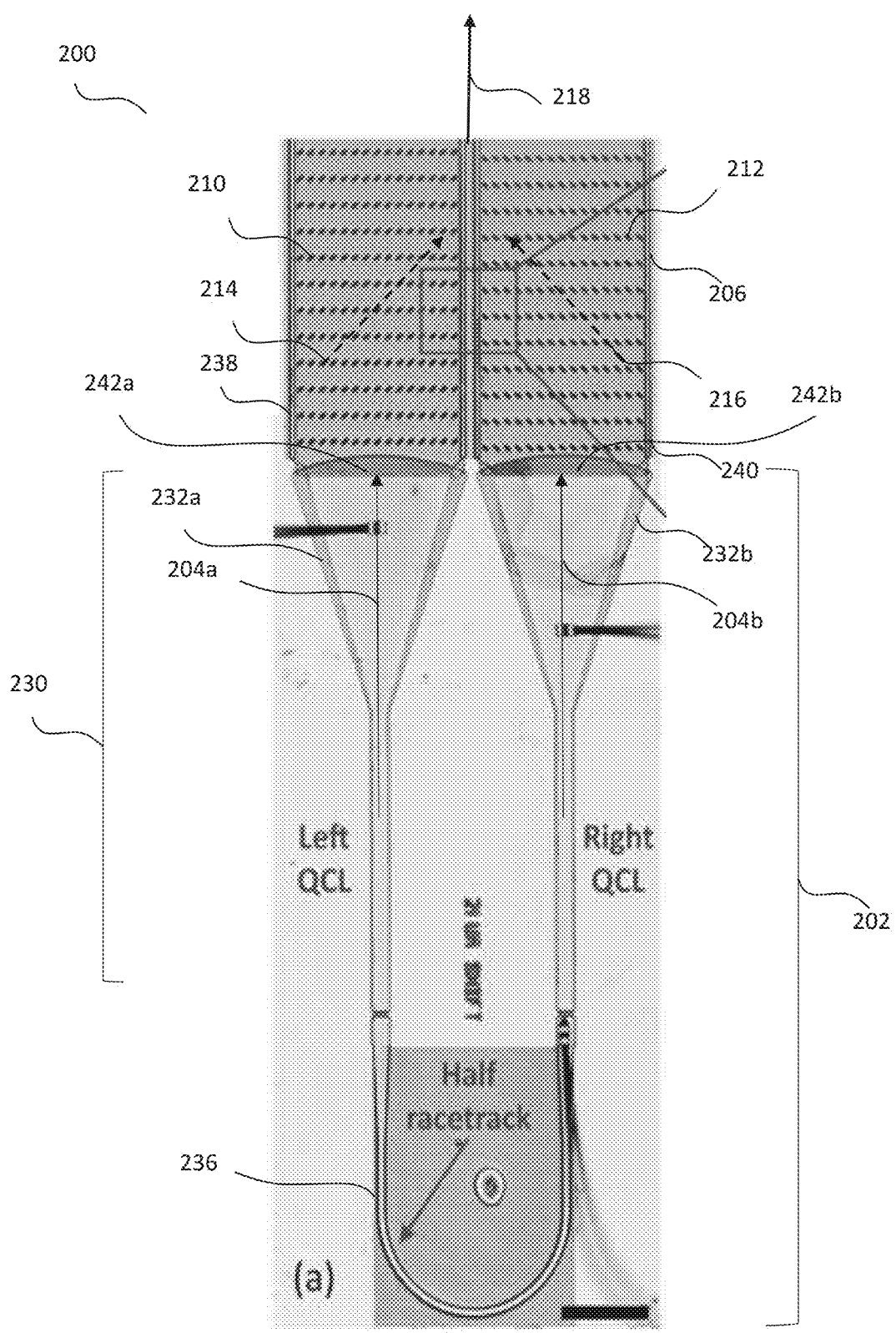
FIG. 2 shows a schematic view of a light source, according to various embodiments.

Non-limiting examples of the light source of various embodiments will now to be described with reference to FIG. 2. The light source 200 may include a coherent light generator arrangement 202, and a waveguide arrangement 206 optically coupled to each other. The coherent light generator arrangement 202 may include an active region 230 which is a region of the coherent light generator arrangement 202 where light is generated. The coherent light generator arrangement 202 may include two resonating regions or cavities 232a, 232b which may generate two output lights 204a, 204b respectively. An adjoining waveguide structure 236 may be arranged in between the two resonating regions 232a, 232b. The adjoining waveguide structure 236 may function as a phase locking mechanism, to lock the phases of the respective output lights 204a, 204b to each other so that the respective output lights 204a, 204b are in phase (or, phase-shifted by π). In this example, the adjoining waveguide structure 236 is in the form of a half racetrack structure.

A plurality of first resonator elements (indicated by 210 for one such resonator element) and a plurality of second resonator elements (indicated by 212 for one such resonator element) are provided for the light source 200. The waveguide arrangement 206 may include a first waveguide structure 238 and a second waveguide structure 240. The first waveguide structure 238 may be optically coupled to the resonating region 232a. The first waveguide structure 238 may include the plurality of first resonator elements 210. The second waveguide structure 240 may be optically coupled to the resonating region 232b. The second waveguide structure 240 may include the plurality of second resonator elements 212. The coherent light generator arrangement 202 may include two tapering portions 242a and 242b which may be arranged to optically couple the two output lights 204a, 204b respectively to the first waveguide structure 238 and the second waveguide structure 240. The two tapering portions 242a and 242b may collimate the two output lights 204a, 204b in the lateral direction towards the first waveguide structure 238 and the second waveguide structure 240.

The first waveguide structure 238 and the second waveguide structure 240 may interact with the two output lights 204a, 204b respectively to cause the plurality of first resonator elements 210 and the plurality of second resonator elements 212 to emit respective first 214 and second 216 optical signals. The first and second optical signals 214, 216 may co-operatively interact with each other to generate an output optical signal 218.

In operation, the light source 200 may change a polarization characteristic of the output optical signal 218 in response to at least one electrical signal applied to the light source 200 to vary at least one of respective magnitudes of the first 214 and second 216 optical signals relative to each other.

Design of an Integrated Terahertz (THz) GaAs-, or Si-, or InP-loaded Surface Plasmon (SP) Waveguide In a terahertz (THz) quantum cascade laser (QCL), the use of a metal-metal waveguide has led to the realization of high performance THz QCLs. Nonetheless, using it as a passive waveguide would be quite lossy. In addition, as its optical modes are sandwiched by the two metal plates, it is not convenient to have the optical modes interact with other materials placed onto of the waveguide. Alternatively, known dielectric waveguides relying on refractive index confinement may be an option. However, it requires unrealistic thick material growth owing to the long wavelength of THz wave.

Surface plasmons (SPs) have underpinned a breadth of studies at short wavelengths (from the visible to the mid-infrared), owing to their capability for confining and manipulating optical waves on a subwavelength scale. SP waveguiding on a cylindrical metal wire has been shown to be a promising low-loss THz waveguiding method. However, in the THz region, a flat metal surface may not support confined SPs because of the negligible penetration depth of the THz wave into the metal. To confine THz wave onto a metal surface, subwavelength-structured metal surfaces, which support 'spoof' SPs in the same way that a flat metal surface supports SPs in the short wavelength range may be used. The resulting surface wave was thus called "spoof surface plasmon (SSP)". However, given their complexity in design and fabrication, such subwavelength-structured metal surfaces may not be easily integrated with optoelectronic devices, or combined with other optical functionalities.

A dielectric-loaded surface plasmon (DLSP) waveguide may confine and propagate THz waves on a flat surface. The DLSP waveguide may be much simpler, in both design and fabrication, than using a structured metal surface as it comprises simply a dielectric coated metal layer (see, for example, FIG. 3A).

A GaAs-, or Si-, or InP-loaded surface plasmon (SP) waveguide may confine and propagate THz waves on a flat surface. The GaAs-, or Si-, or InP-loaded SP waveguide may be much simpler, in both design and fabrication, than using a structured metal surface as it comprises simply a GaAs-, or Si-, or InP-coated metal layer (see, for example, FIG.3A).

In a non-limiting example, the waveguide arrangement of various embodiments may include a GaAs-loaded surface plasmon (SP) waveguide. FIG. 3A shows a schematic diagram illustrating geometry of a double-metal ridge terahertz (THz) quantum cascade laser (QCL) 302a with an integrated GaAs-loaded surface plasmon (SP) waveguide 306. The SP waveguide 306 may include a layer 307 of gallium arsenide (GaAs), although other materials may also be used, such as silicon (Si), and indium phosphide (InP). The GaAs layer 307 may be QCL active region 330 itself, which may simplify the light source (e.g., 200) of various embodiments and also the light source fabrication as no additional material growth may be required. The double-metal ridge THz QCL 302a may include a 10-μm-thick active region 330 which may be sandwiched between two metal plates 308a, 308b, and the SP GaAs-loaded SP waveguide 306 may be formed by coating the bottom metal plate 308b with a thin GaAs layer 307 (QCL active region 330 in real device (light source)). The two metal plates 308a, 308b may be gold (Au). The emitted light from the QCL may be transverse-magnetic (TM) polarized.

FIG. 3B shows a cross-sectional electric field (amplitude) distribution of the double-metal ridge terahertz (THz) quantum cascade laser (QCL) 302a of FIG. 3A. Different from a dielectric-loaded surface plasmon (DLSP) waveguide in short wavelength, where the propagation mode may be a hybridization of the surface plasmon mode and the dielectric waveguide mode, the guiding mode of the GaAs-loaded SP waveguide 306 of FIG. 3A may be a surface wave tightly confined at the surface 309 of the gallium arsenide (GaAs) layer 307 (e.g., GaAs-air interface). As very little electric field may penetrate into the underneath GaAs layer 307, the GaAs-loaded SP waveguide 306 may be of low loss. Also, by suitable choice of the thickness of the GaAs layer 307, the terahertz (THz) electric field may be confined at the GaAs surface 309 (GaAs-air interface), with little field residing in the GaAs layer 307, which may lead to a low propagation loss in the waveguide 306.

FIG. 3B also shows the efficient coupling of the THz wave (free-space wavelength $\lambda_0$=96 μm) emanating from the QCL 302a (with a double-metal waveguide) to the integrated GaAs-loaded SP waveguide 306. It may be observed that the THz wave is strongly confined to the GaAs surface 309 with an evanescent tail of only ~30 μm ($\lambda_0$=96 μm) penetrating into the air, with the electric field profile along the dashed line 350 depicted by the curve 351.

The THz radiation may be coupled from the QCL 302a into the integrated GaAs-loaded SP waveguide 306, with a coupling efficiency of approximately 55% for a 5 μm thick GaAs layer 307.

FIG. 3C shows a schematic diagram illustrating geometry of a double-metal ridge terahertz (THz) quantum cascade laser (QCL) 302b (similar to that of FIG. 3A without the integrated GaAs-loaded surface plasmon (SP) waveguide (e.g., 306). The emitted light 304 from the QCL 302b may be transverse-magnetic (TM) polarized.

As a comparison, FIGS. 3C and 3D give a schematic illustration of the double-metal ridge THz QCL 302b, and plot of electric field distribution when there is no gallium arsenide (GaAs)-loaded SP waveguide. No bound surface wave may be observable on the bottom metal surface 308c. The electric field profile along the dashed line 352 is depicted by a solid line 353, indicating no surface plasmon wave. Note that the scales of the solid lines in FIG. 3B and FIG. 3D are not the same, the electric amplitude along the dashed line in FIG. 3B is much stronger than that in FIG. 3D.

As a comparison, FIGS. 3C and 3D give a schematic illustration of the double-metal ridge THz QCL 302b, and plot of electric field distribution when there is no gallium arsenide (GaAs)-loaded SP waveguide. No bound surface wave may be observable on the bottom metal surface 308c. The electric field profile along the dashed line 352 is depicted by a solid line 353, indicating no surface plasmon wave. Note that the scales of the solid lines in FIG. 3B and FIG. 3D are not the same, the electric amplitude along the dashed line in FIG. 3B is much stronger than that in FIG. 3D.

Metasurfaces for Output Polarization Control of Terahertz (THz) Quantum Cascade Lasers (QCLs)

The variation of propagation length and coupling efficiency of the terahertz (THz) emission from the quantum cascade laser (QCL) (e.g., 302a) into the GaAs-loaded surface plasmon (SP) waveguide (e.g., 306) may be calculated as a function of the gallium arsenide (GaAs) thickness. The results are shown in FIG. 3E illustrating a plot of the calculated propagation length and coupling efficiency of the THz radiation into the GaAs-loaded SP waveguide as a function of the GaAs thickness. For the GaAs layer (e.g., 307), which may be a part of the QCL active region (e.g., 330) itself, a refractive index of 3.5 and a material loss of 11 cm$^{-1}$ may be used (corresponding to an average doping of 5×10$^{15}$ cm$^{-3}$). The complex refractive index of the metal (e.g., metal plates 308a and 308b) (which in this non-limiting example is gold, although other metals such as copper and aluminium may also be suitable) may be calculated to be 238+552i using Drude-Lorentz approximation. It should be appreciated that the thicker the GaAs layer, the higher the coupling efficiency of the light from the QCL to the GaAs-loaded SP waveguide, but this may be accompanied by a larger waveguide loss and, thus, a shorter propagation length. In this non-limiting example, a GaAs layer thickness of 5 μm may be chosen to maintain a high coupling efficiency (55%) while simultaneously allowing a reasonable propagation length (3.3 mm). In the GaAs-loaded SP waveguide, the metal (e.g. bottom metal plate 308b) and the thin (compared to the free-space wavelength $\lambda_0$) GaAs layer may constitute an effective medium for THz waves, with an average concentration of electrons that may be reduced so that the THz wave may penetrate more easily into the medium. This may lead to a larger effective refractive index (e.g., ne$_{eff}$=1.13), which thereby may render the THz field bound onto the GaAs-air interface which is reflected by the short evanescent tail (see, e.g., FIG. 3B), which is given by $\lambda_0/(2\pi\sqrt{n_{eff}^2-1})$. A larger $n_{eff}$ may reduce the impedance mismatch of the electromagnetic wave between the metal-metal waveguide of QCL and the outer GaAs-loaded SP waveguide, which may lead to a higher coupling efficiency of the THz wave from the QCL to the GaAs-loaded SP waveguide, as well as a higher output power. Simulations (results not shown) show that the presence of the GaAs-loaded SP waveguide increases the output power by approximately 40%.

Figures 4A, 4B, 4C, 4D:
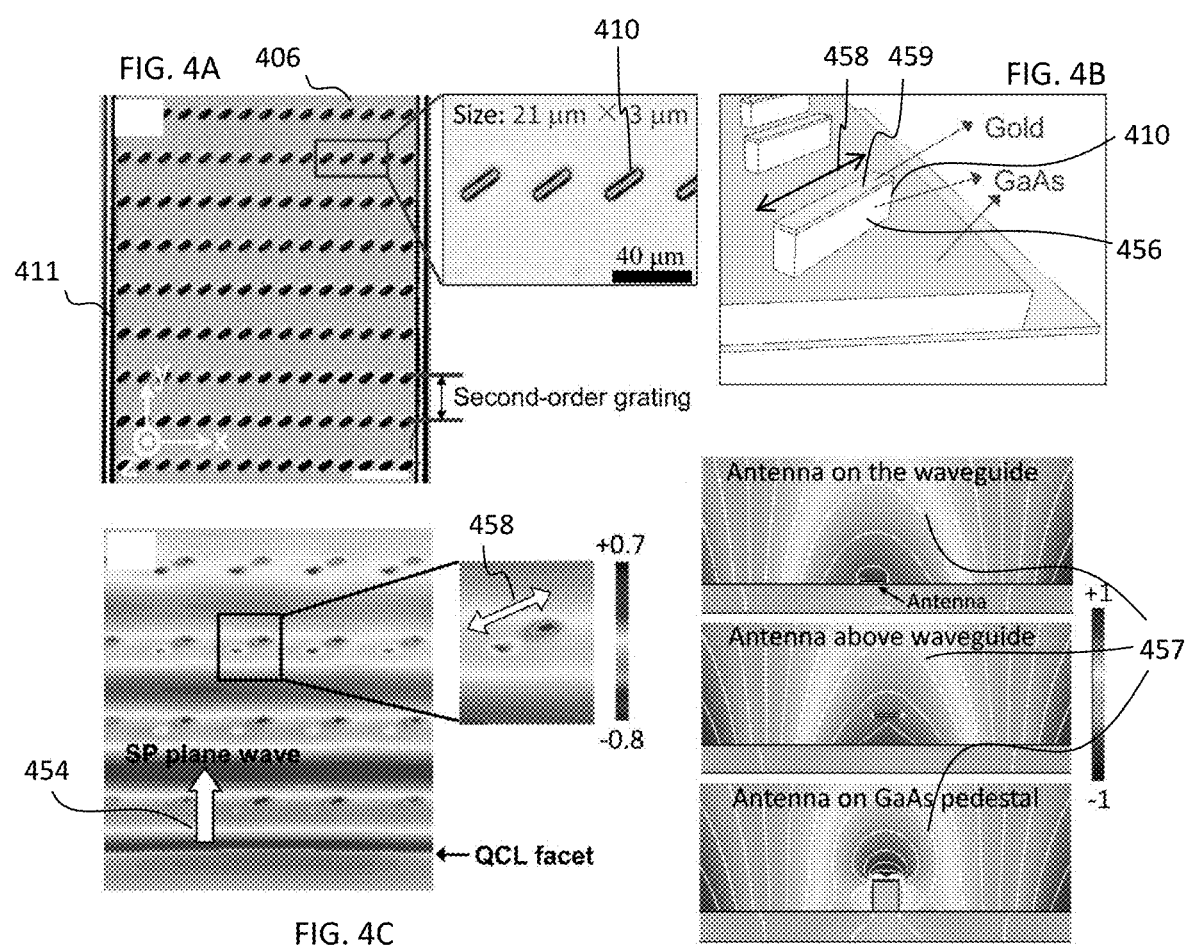
FIG. 4A shows an optical microscope image of an antenna structure (white scale bar=100 μm), according to various embodiments.
FIG. 4B shows a schematic illustration of the (antenna) structure, according to various embodiments.
FIG. 4C shows the calculated electric field distribution ($E_z$) on a plane 2 μm above the antennas.
FIG. 4D shows the scattering effect of the antennas when placed at different positions.

FIG. 4A shows an optical microscope image of an antenna structure or arrangement, according to various embodiments. An array or plurality of antenna elements (or resonator elements) 410 may be provided. As a non-limiting example, each antenna element 410 may be a subwavelength metallic (gold) antenna. In various embodiments, these subwavelength metallic antennas 410 may be incorporated into the GaAs-loaded surface plasmon (SP) waveguide 406. To produce a narrow directional terahertz (THz) beam from a set of antennas 410, and to project the polarization of the scattering light into the orientation of the antenna 410, the set of antennas 410 may be arranged into an array and may be arranged to form a second-order grating with a period of about 80 μm, which is slightly smaller than the surface plasmon (SP) wavelength (85 μm for $\lambda_0$=96 μm), so that a directional output beam may be produced. While not shown in the figures, it should be appreciated that the constructive interference of the THz radiation from each antenna 410 may lead to a collimated beam pointing normal to the antenna structure surface 459. Moreover, as the power from each quantum cascade laser (QCL) may be adjusted independently, the polarization of the combined beam may evolve continuously from linear to circular polarization. The dimensions of each antenna 410 (a single antenna) may be approximately 21 μm×3 μm×0.4 μm, and the lateral separation may be 37 μm —subwavelength so as to minimise or not to introduce diffraction, but sufficiently large to minimise or avoid coupling between neighbouring sites (the selection of these dimensions will be discussed later further with reference to FIGS. 8A and 8B). The vertical gold bars 411 at the two sides define the boundaries of the antenna array, and do not affect the operation.

FIG. 4C shows the calculated electric field distribution ($E_z$) on a plane 2 μm above the antennas 410 (see FIGS. 4A, 4B). The antennas 410 may be excited by the propagating surface plasmon (SP) plane wave 454 generated from or optically coupled from a terahertz (THz) quantum cascade laser (QCL) (not shown), which may result in electric dipoles oscillating along the antenna lengths 458. The resultant oscillating electric dipoles may emit THz radiation polarized in the same direction. In contrast to known methods, where slot antennas drilled on a metal film were used as a polarization-sensitive element, the strip-type antenna element 410 of various embodiments, as described herein, may respond to, and may re-emit, the electric field component parallel to its elongation. This is because the slot and strip antennas are complementary, with their electric and magnetic fields interchanged—the slot antenna generates a magnetic dipole oriented along the slot with an induced electric field orthogonal to the slot.

FIG. 4D shows the scattering effect of the antennas when placed at different positions. Plotted in the diagrams are the $E_z$ distribution and the contour of the $E_z$ field (white lines 457). The use of the 5-μm-high gallium arsenide (GaAs) pedestal 456 (see FIG. 4B) may enhance the scattering effect of the antenna 410 on top of it (see bottom image of FIG. 4D), owing to it acting as a GaAs-loaded antenna. Without the GaAs pedestal 456, an antenna placed 5 μm above the GaAs-loaded surface plasmon (SP) waveguide shows no significant difference in scattering strength (see middle image of FIG. 4D) compared with an antenna placed directly on the waveguide surface (see upper image of FIG. 4D).

FIG. 4D shows the scattering effect of the antennas when placed at different positions. Plotted in the diagrams are the $E_z$ distribution and the contour of the $E_z$ field (white lines 457). The use of the 5-μm-high gallium arsenide (GaAs) pedestal 456 (see FIG. 4B) may enhance the scattering effect of the antenna 410 on top of it (see bottom image of FIG. 4D), owing to it acting as a GaAs-loaded antenna. Without the GaAs pedestal 456, an antenna placed 5 μm above the GaAs-loaded surface plasmon (SP) waveguide shows no significant difference in scattering strength (see middle image of FIG. 4D) compared with an antenna placed directly on the waveguide surface (see upper image of FIG. 4D).

Phase Locking of the Terahertz (THz) Quantum Cascade Lasers (OCLs)

Figures 5A, 5B, 5C:
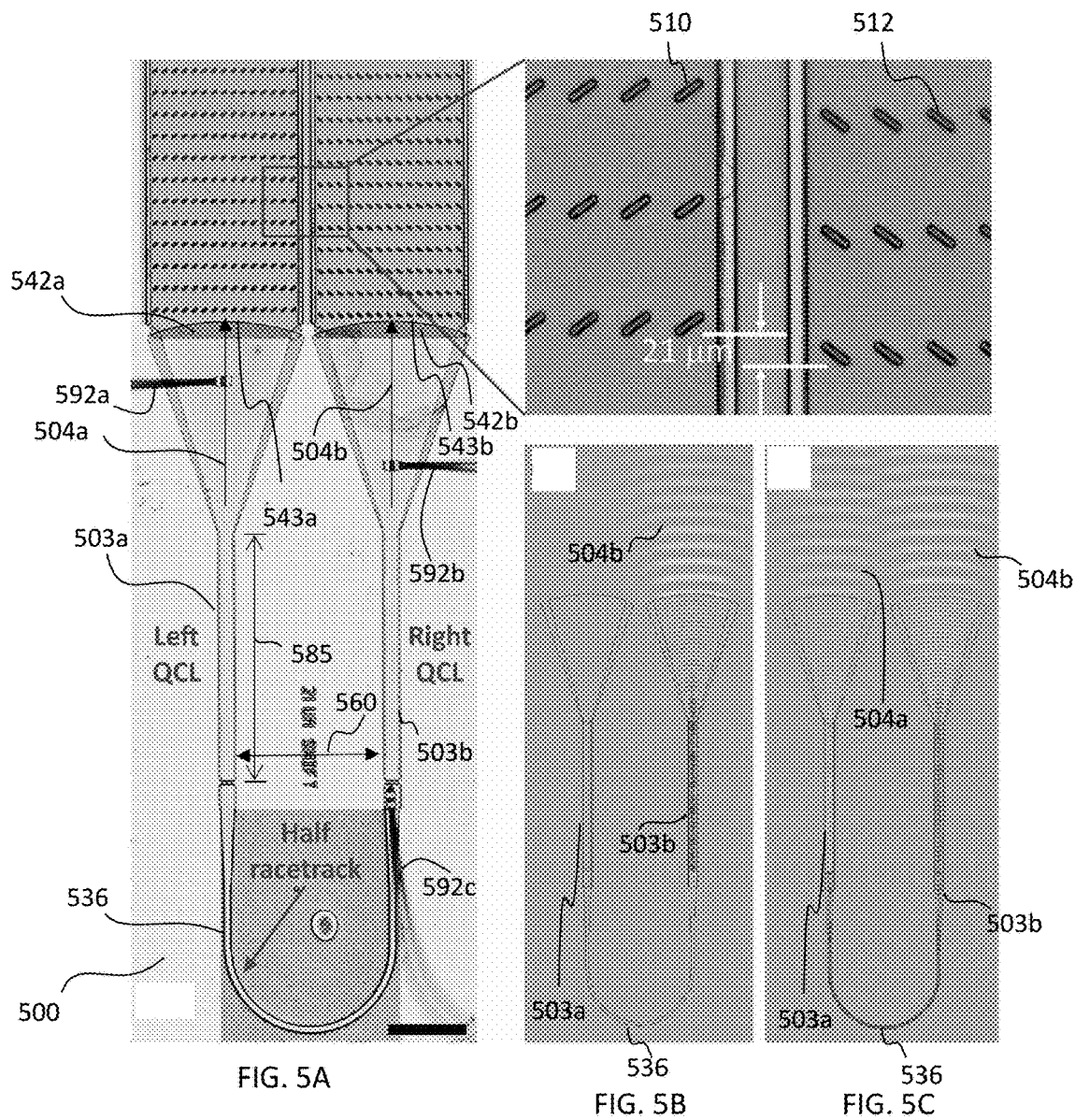
FIG. 5A shows an optical microscope image of a fabricated device (light source), according to various embodiments.
FIG. 5B shows a simulated electric field distribution in the fabricated light source.
FIG. 5C shows a simulated electric field distribution in the fabricated light source.

FIG. 5A shows an optical microscope image of a fabricated device 500 (light source), according to various embodiments. The scale bar shown in FIG. 5A represents 300 µm. The light source 500 is a non-limiting example of a polarization tunable quantum cascade laser (QCL) device of various embodiments.

In various embodiments, the light source may include two sets of antennas 510, 512 (part of the antennas are shown in an expanded view as part of FIG. 5A). The two sets of antennas 510, 512 may be arranged cross oriented to each other, and may be vertically shifted by 21 µm, which is around one quarter of the surface plasmon (SP) wavelength (85 µm). As one SP wavelength offset corresponds to $2\pi$ phase retardation, this value of 21 µm may induce a $\sim\pi/2$ phase difference in the excitation of the two antenna arrays 510, 512, which are also cross polarized. If the emission direction of the light source 500 is normal to the wafer surface, e.g., the topview surface of the light source (as it may be), no additional phase difference may be accumulated during free-space propagation of terahertz (THz) waves, the phase difference in the excitation of the two antenna arrays 510, 512 may be mirrored in their emissions in the far field.

In the light source 500, two THz QCLs 503a, 503b are used to emit two output to beams 504a, 504b. Each of the QCLs 503a, 503b may be designed with a tapered structure 542a, 542b to collimate the THz light (emitted beams or output beams) 504a, 504b in the lateral direction. The power of the THz light 504a, 504b may be simultaneously amplified as a result of the tapering portions 542a, 542b. The antenna structures 510, 512 may be fed by the tapered THz QCLs 503a, 503b, as shown in FIG. 5A. For a large tapering angle (e.g. 36°), a flat output facet may not be suitable as it may distort the emitted beam (e.g., output beams 504a, 504b) owing to the large mismatch between the wavefront radiated from the ridge segment 585, and the shape of the facet. Therefore, it may be designed to be an arc 543a, 543b centered 20 µm below the taper-ridge interface. In various embodiments, the tapering angle may range between 0° to 45°. For clarity, the texts in between the QCLs 503a, 503b in FIG. 5A refer to "21 µm shift".

A half racetrack waveguide structure 536 may be used to phase lock the left and right THz QCLs 503a, 503b so that the emissions (output beams 504a, 504b) from the two QCLs 503a, 503b are in phase (or, phase-shifted by $\pi$), to ensure coherent interference of the radiation from the sets of antennas 510, 512. The half racetrack section 536 may be electrically insulated from the QCLs 503a, 503b by etching down to the bottom of the active region using inductively coupled plasma (ICP) etching, and forming a gap 560. The width of the gap 560 may be chosen such that the two lasers (503a, 503b) may not be so strongly coupled that independent control of the intensity from each QCL 503a, 503b may be affected, but sufficiently narrow to enable phase locking, and to minimize undesired scattering of THz emission into the far field. The best tradeoff may be a gap of 20 µm, as determined by simulations using a finite-element-method solver/software. It should be appreciated that the fixed phase relation between the two lasers (e.g., 503a, 503b) may be achieved by injecting a portion of an output light from one laser (master) (e.g. 503b or 503a) into the other laser (slave) (e.g., 503a or 503b), which may have an eigenfrequency the same as (or very close to) the frequency of the injecting light. Since the injection may be seen as an additional gain to the slave laser, the optical mode of the slave laser with the same frequency may be excited, even if it may be originally operating at other modes/frequencies. In various embodiments, as the injection of light may be bi-directional, the phase-locking may be understood in the framework of mutual injection locking. On the other hand, it may also be interpreted as to weakly coupled cavities. The coupling may be weak because the power reflection at a back facet by the gap 560 is ~60% due to the strong subwavelength vertical confinement by the two metals (e.g., the top and bottom metal plates 308a, 308b), and only <10% of the incident light may be coupled into the half racetrack structure 536. Therefore, if the half racetrack 536 is transparent (without gain nor loss), less than 1% of the light from one laser may be coupled to the other laser (which will be discussed later with reference to FIGS. 9A and 9B). In the polarization measurements of light source 500, the half racetrack structure 536 may be biased at 0.53 A, which is near the transparent point.

Electrical conductors 592a, 592b and 592c may be provided to allow electrical signals (injection currents) to be provided to the two QCLs 503a, 503b, and the half racetrack structure 536 respectively, for generating the output beams 504a, 504b from the two QCLs 503a, 503b.

FIG. 5B shows the simulated electric field distribution in the light source 500 of the emission (output beam 504b) when only the right hand quantum cascade laser (QCL) 503b is electrically pumped, whilst FIG. 5C shows the simulated electric field distribution in the light source 500 of the emission (output beams 504a and 504b) when both QCLs 503a, 503b, as well as the half racetrack structure 536, are pumped simultaneously, but with different injection currents. Laterally collimated output beams 504a, 504b may be observed in FIGS. 5B and 5C. The phase locking scheme allows relatively independent control of the intensity from each QCL 503a, 503b (which will be discussed later with reference to FIGS. 10A and 10B).

Figure 5D:
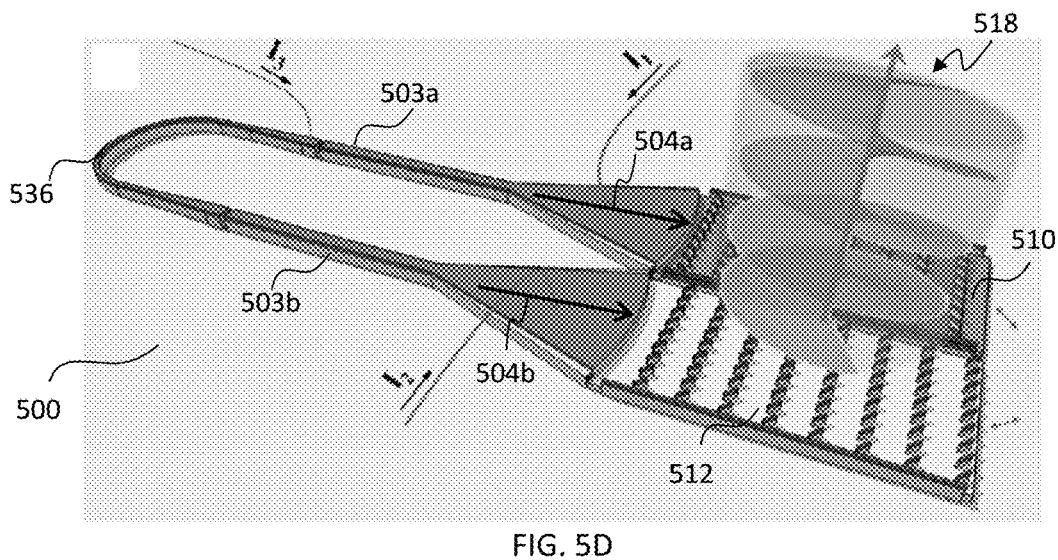
FIG. 5D shows a schematic diagram illustrating an output optical signal generated from the light source of FIG. 5A.

FIG. 5D shows a schematic diagram illustrating an output optical signal 518 generated from the light source 500. Both QCLs 503a, 503b, as well as the half racetrack structure 536 may be pumped with injection currents $I_1$, $I_2$, and $I_3$ respectively. As a result, the QCLs 503a, 503b may emit two output beams 504a, 504b towards the first set of antennas 510 and the second set of antennas 512 respectively. The first and the second sets of antennas 510, 512 may then interact with the two output lights 504a, 504b to generate respective optical signals (e.g., 214, 216) that co-operatively interact with each other to generate the output optical signal 518. As a non-limiting example, the respective optical signals may mix with each other and form a signal optical beam (output optical signal 518) at some distance (e.g., several wavelengths) above the wafer surface. As shown in FIG. 5D, the output optical signal 518 may be emitted in a direction normal to the surfaces of the first and the second sets of antennas 510, 512. Further, as a result of the vertical shift between the two sets of antennas 510, 512, the output optical signal 518 may be circularly polarised as illustrated in FIG. 5D.

Fabrication Process

Figure 6A:
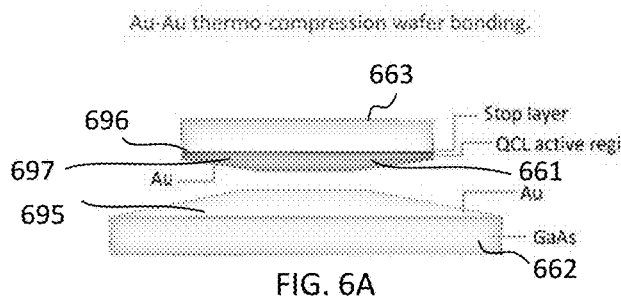
FIGS. 6A to 6J show, as perspective views, various processing stages of a method for fabricating a light source, according to various embodiments.

FIGS. 6A to 6J show, as perspective views, various processing stages of a method for fabricating a light source, according to various embodiments. Non-limiting examples of the steps of the fabrication process are as follow:

Referring to FIG. 6A, fabrication of the light source of various embodiments may start with gold-gold (Au-Au) thermo-compression bonding of a quantum cascade laser (QCL) active layer 661 (for forming the QCL active region) onto an n+gallium arsenide (GaAs) receptor wafer 662 having a gold layer 695. The QCL active layer 661 may be provided on a quantum cascade laser (QCL) substrate 663, sandwiched between a gold layer 697 and a stop layer 696.

Figure 6B:
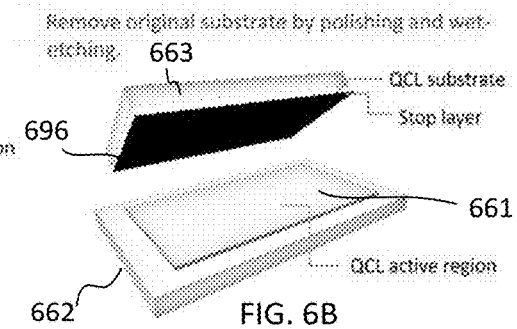

Referring to FIG. 6B, the original QCL substrate 663 may then be removed by a combination of lapping and selective chemical etching, leaving a 10-μm-thick active layer 661 on the wafer 662.

Figure 6C:
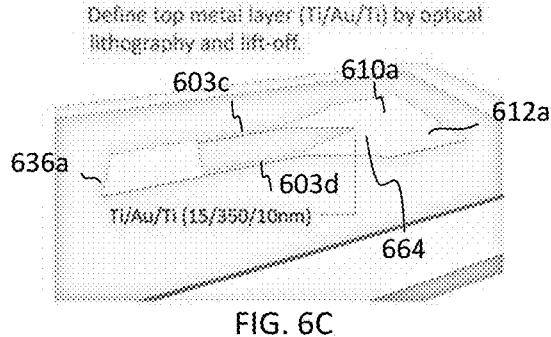

Referring to FIG. 6C, the top contact 603c, 603d, 636a for the quantum cascade lasers (QCLs), the half racetrack, and rectangles 610a, 612a covering the whole antenna areas, may be next defined by optical lithography and lift-off of a titanium/gold/titanium (Ti/Au/Ti) (15 nm/350 nm/10 nm) layer 664. The additional 10 nm titanium (Ti) layer of the layer 664 may be employed to allow firm adherence of a subsequently-grown silicon dioxide (SiO$_2$) film onto the metal (Au) surface.

Figure 6D:
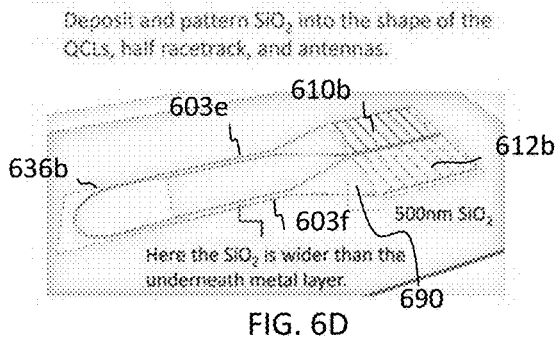

Referring to FIG. 6D, silicon dioxide (SiO$_2$) 690 may be deposited by plasma-enhanced chemical vapor deposition (PECVD) and may then be patterned into the shape of the quantum cascade lasers (QCLs) 603e, 603f, the shape of the half racetrack 636b and the shape of the antennas 610b, 612b using optical lithography and reactive-ion etching (RIE) with an oxygen (O$_2$) and tetrafluoromethane (CF$_4$) gas mixture.

Figure 6E:
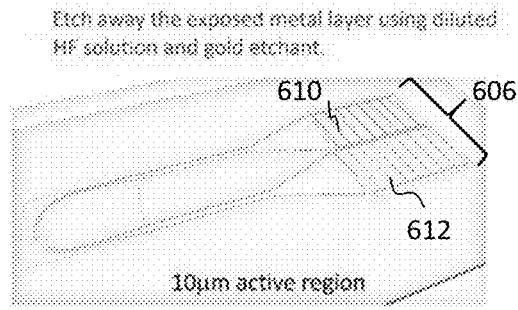

Referring to FIG. 6E, antennas 610, 612 may then be defined by wet etching away the exposed metal layer (with no patterned SiO$_2$) in the surface plasmon (SP) waveguide region 606 using a diluted hydrogen flouride (HF) solution and gold (Au) etchant.

Figure 6F:
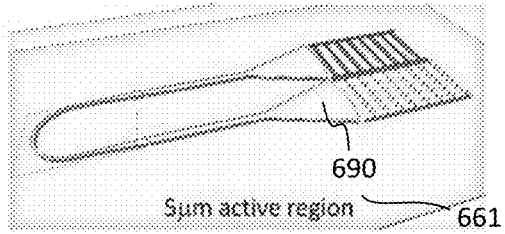

Referring to FIG. 6F, the active layer 661 may be subsequently etched by inductively coupled plasma (ICP) to a depth of 5 μm with the patterned silicon dioxide (SiO$_2$) 690 as a mask using an argon (Ar), clorine (Cl$_2$) and boron trichloride (BCl$_3$) gas mixture.

Figure 6G:
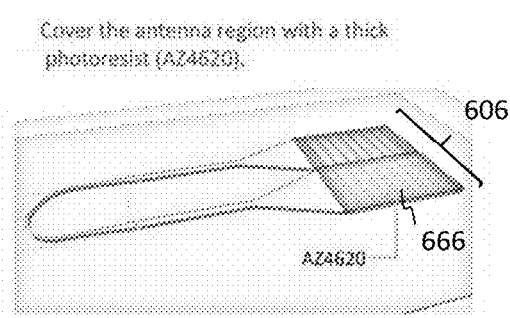

Referring to FIG. 6G, the whole surface plasmon (SP) waveguide region 606 may be next covered by a thick photoresist 666 and patterned.

Figure 6H:
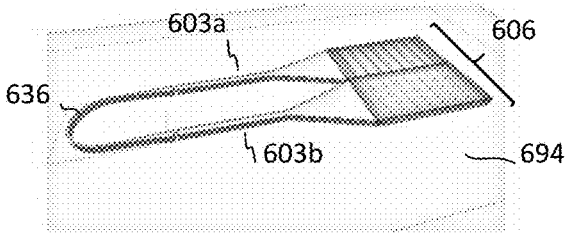

Referring to FIG. 6H, the surface plasmon (SP) waveguide region 606, the half racetrack 636, and the quantum cascade lasers (QCLs) 603a, 603b may then be defined. A second inductively coupled plasma (ICP) etching may be performed to etch the active layer 661 outside the surface plasmon (SP) waveguide region 606, the half racetrack 636, and the quantum cascade lasers (QCLs) 603; 603b mesas down to the bottom metal layer 694 (e.g., gold layer 695 and/or 697).

Figure 6I:
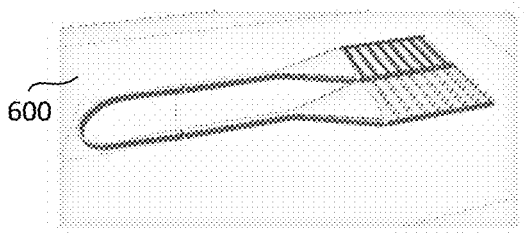

Referring to FIG. 6I, the thick photoresist 666 may be removed by acetone, and a further reactive-ion etching (RIE) etch may be carried out to remove the silicon dioxide (SiO$_2$) mask 690 and the underlying adhesive titanium (Ti) layer that was part of the layer 664. As illustrated, a light source 600 may be formed.

Figure 6J:
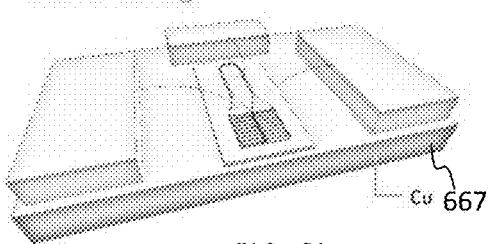

Referring to FIG. 6J, the substrate (e.g., 662) may be thinned to 120 μm and a 20/300 nm titanium/gold (Ti/Au) layer may be deposited to form a bottom contact. The samples may be cleaved, indium-mounted on copper (Cu) submounts 667, and wire-bonded, and may then be attached to the cold finger of a cryostat for measurement for assessment of the performance of the light source (e.g., 600). This may be for all the measurements described herein, including light-current-voltage curves, spectra, far-field, and polarization.

Light-Current-Voltage (LIV) Characteristic, and Spectra, of a Quantum Cascade Laser (QCL)

FIGS. 7A and 7B show respectively a plot of light-current-voltage (LIV) characteristic, and spectras with increasing current, of a right quantum cascade laser (QCL) (e.g. 503b, FIG. 5A) at 10 Kelvin (K). The QCL may operate up to 120 K under pulse mode operation (e.g., 500 ns pulse width, 10 kHz repetition rate), which may be comparable to that of known (double-metal waveguide) ridge lasers fabricated from the same QCL wafer, with a maximum operating temperature of 136 K under the same operating conditions. While not shown in FIGS. 7A and 7B, the left QCL may produce similar light-current-voltage (LIV) curves, and spectra that may be only slightly modified.

Selection of the Antenna Dimensions and Lateral Separation

Figure 8A:
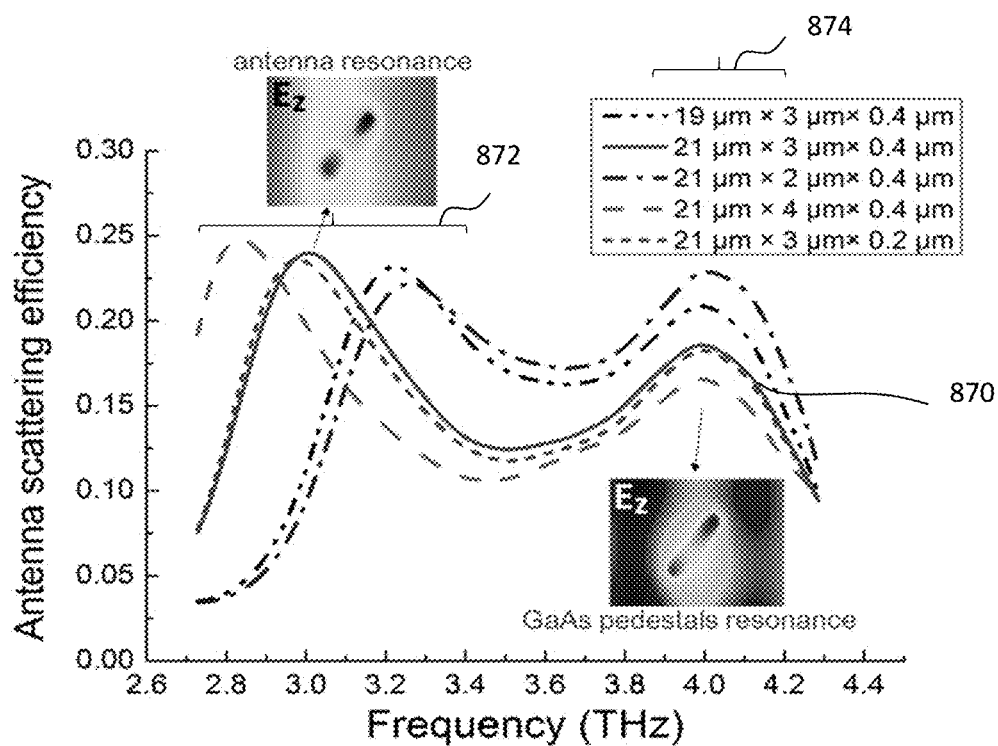
FIG. 8A shows a plot of the scattering efficiency of antennas with different dimensions, according to various embodiments.

FIG. 8A shows a plot of the scattering efficiency of antennas with different dimensions, according to various embodiments. The dimensions of the antennas may be chosen to let the antennas resonate at a targeted frequency (~3.0 terahertz (THz)) so as to strengthen their scattering efficiency. The resonance frequency may be mainly determined by the length and width of the antenna. The effect of the thickness of the antennas may be minor as it varies from 200 nm to 500 nm, so the thickness of the antennas may be the same as the thickness of the top contact of the laser (~400 nm) so that the antennas and the laser contact may be deposited at the same time in fabrication (see FIG. 6C). To suppress the electric field component polarized perpendicular to the antenna length, the width may be kept as narrow as possible. However, considering the micro-fabrication limitations and to allow for some fabrication tolerance, a width of 3 μm may be chosen. The length of the antenna may then be determined to be 21 μm, assisted by Finite-difference time-domain (FDTD) simulations (FIG. 8A). The solid line 870 may correspond to an antenna design, which has a resonant frequency at ~3.0 terahertz(THz). The first peak 872 in the curves may correspond to the antenna dipole resonance, which may produce a linearly polarized light, while the second peak 874 may be related to the resonance in the underneath gallium arsenide (GaAs) pedestal (e.g., 456, FIG. 4B), which may not be desirable.

Figure 8B:
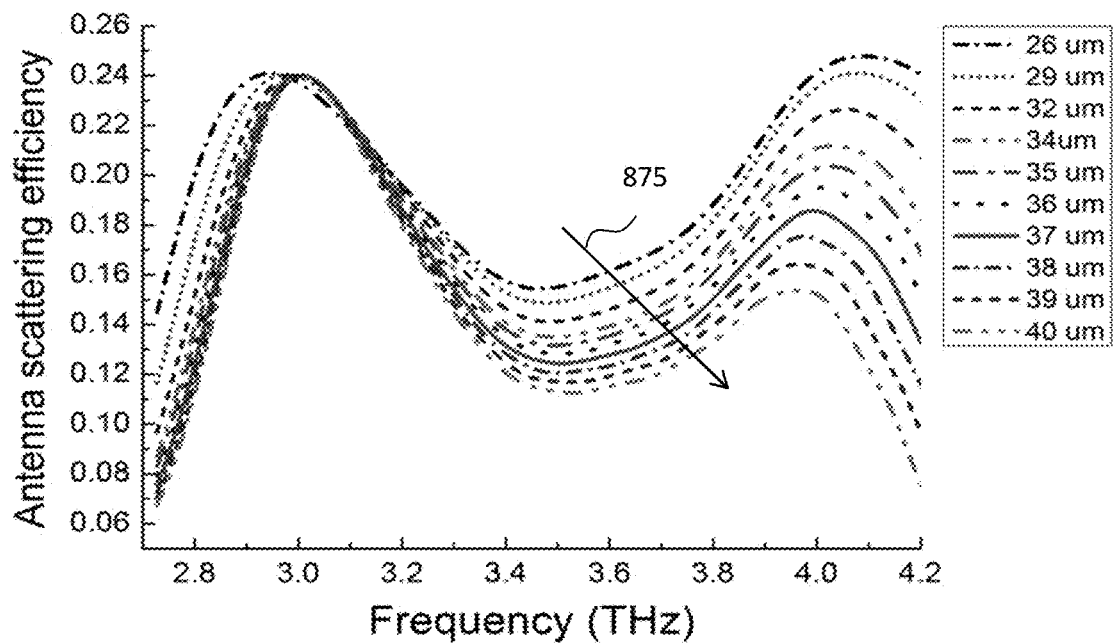
FIG. 8B shows a plot of the resonance of antennas with various lateral separations, according to various embodiments.

FIG. 8B shows a plot of the resonance of antennas with various lateral separations, according to various embodiments. Results are shown for lateral separations of 26 μm, 29 μm, 32 μm, 34 μm, 35 μm, 36 μm, 37 μm, 38 μm, 39 μm and 40 μm, in the order shown by the arrow 875 in FIG. 8B. The lateral separation may be sufficiently large to minimise or avoid coupling between adjacent antennas, i.e., the electric field of a certain antenna may not be affected by the adjacent ones. The shift of the resonant peak around 3.0 terahertz (THz) may be due to the coupling of the adjacent antennas for the lateral separation smaller than 37 μm. When the lateral separation is larger than 37 μm, the antenna resonant peak may be unaffected, indicating that the adjacent antennas may not be coupled anymore. It may be observed that, for the second resonant peak around 4.1 THz, which may correspond to the resonance in the gallium arsenide (GaAs) pedestal, the peak may shift even for lateral separation larger than 37 μm. This may be because this resonant mode may be more spatially extended (lower right inset in FIG. 8A.

Coupling Efficiency of the Half Racetrack Structure

Figure 9A:
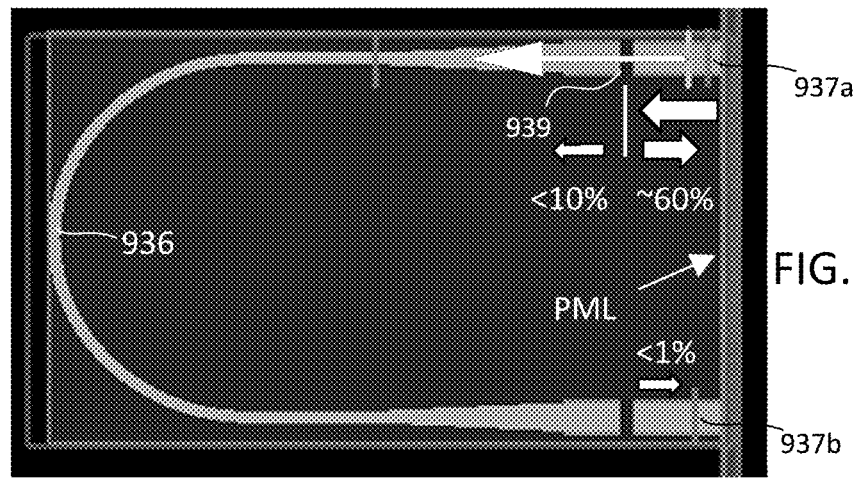
FIG. 9A shows a simulation configuration of the half racetrack structure of various embodiments.

The coupling efficiency of the half racetrack structure may be analyzed by three-dimensional (3D) full-wave finite-difference time-domain (FDTD) simulations. FIG. 9A shows a plot of the simulation configuration of the half racetrack structure 936 of various embodiments, where terahertz (THz) light may be injected from the upper right port 937a. The simulation domain may be surrounded by perfectly matched layers (PML) to absorb any outgoing light without reflection. Approximately, for the THz light injected from the upper right port 937a, ~60% of the light may be reflected back by a gap 939, and ~10% may be coupled into the half racetrack structure 936, with the remaining being scattered out. Further, ~1% of the light may be injected into the lower right port 937b, after propagating through the half racetrack structure 936.

Figure 9B:
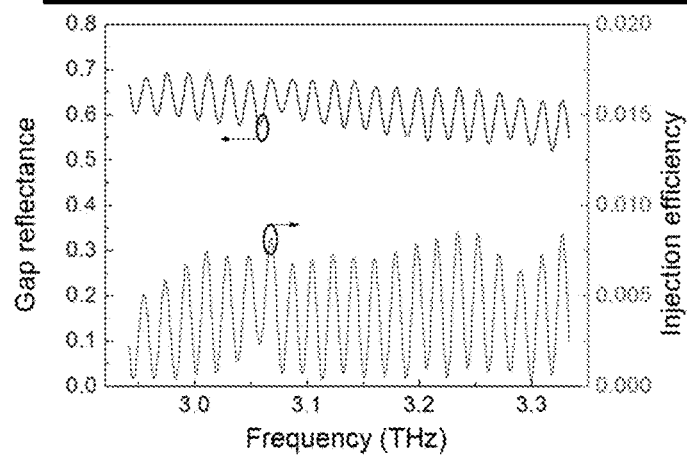
FIG. 9B shows a plot of the calculated gap reflectance (left axis) and percentage of light injected (right axis).

FIG. 9B shows a plot of the calculated gap reflectance (left axis) and percentage of light injected into the lower right port 937b (right axis). The specific values of the reflection and injection efficiency may be frequency-dependent, as shown in FIG. 9B.

Relatively Independent Control of the Intensity from Each Laser

Figure 10A:
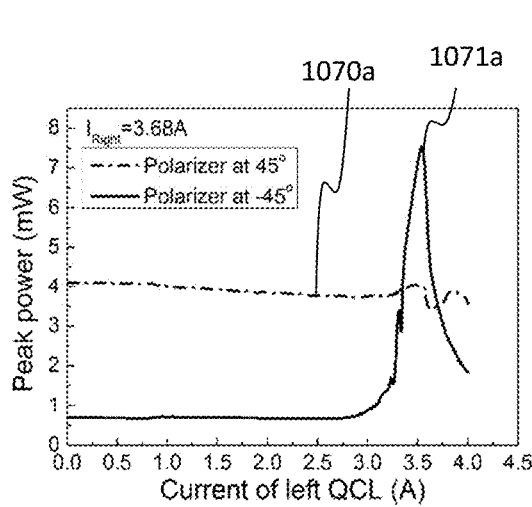
FIGS. 10A and 10B show plots of measured optical powers of a light source through a wire-grid polarizer at different current levels.
Figure 10B:
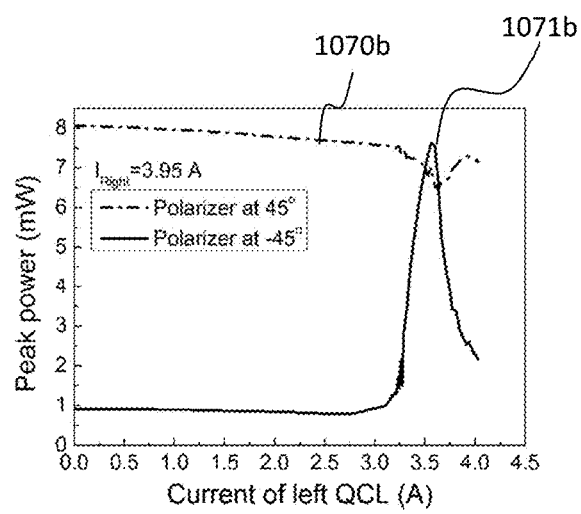

FIGS. 10A and 10B present the measured optical power of a light source passing through a wire-grid polarizer at different current levels, as a function of the injection current to a left quantum cascade laser (QCL) (e.g., 503a, FIG. 5A), while fixing the current of a right QCL (e.g., 503b, FIG. 5A) at 3.68 A (FIGS. 10A) and 3.95 A (FIG. 10B). As the coupling between the two lasers through a half racetrack structure may be relatively weak (1% injection efficiency compared to the 60% reflectance of the gap), the amplitude of each laser may be tuned quite independently. The dash curves 1070a and 1070b correspond to the cases when the wire-grid polarizer is at 45° so that mainly the light from the right QCL may pass through the wire-grid polarizer. The solid curves 1071a and 1071b correspond to the cases when the wire-grid polarizer is at 45° and mainly the light from the left QCL may pass through the wire-grid polarizer. As shown, when changing the current of the left QCL, the powers (dash curves 1070a and 1070b) from the right QCL may remain relatively unchanged. Thus, the power from the left and right QCLs may be tuned rather independently. Therefore, the ratio of the amplitude from the left and right QCLs may be freely tuned so that the polarization of the resulting beam may be widely tunable.

The Vernier Effect of the Light Source or System of Various Embodiments

Figure 11A:
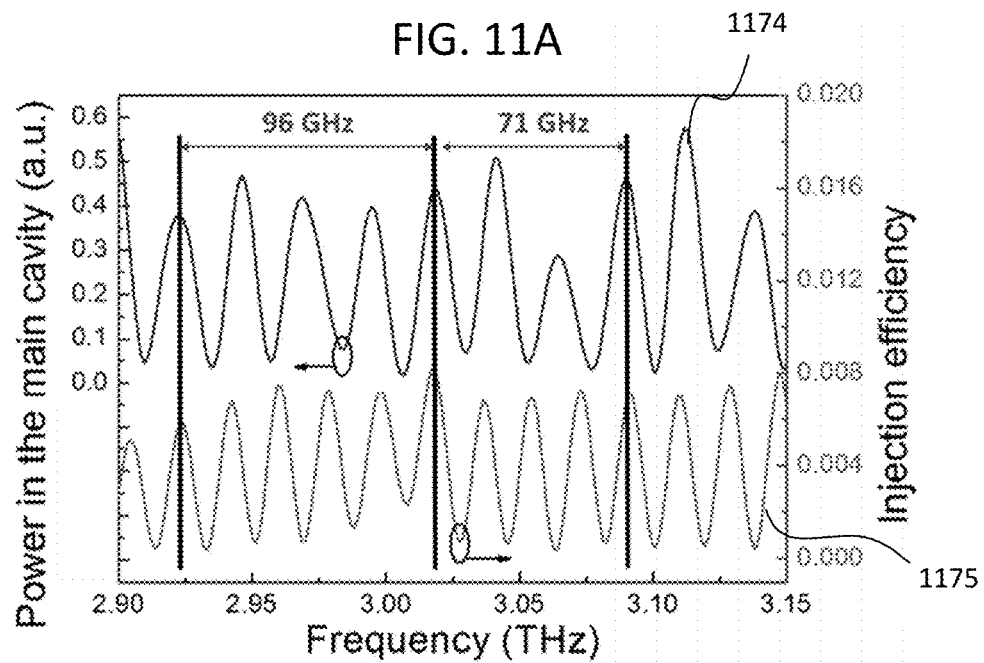
FIG. 11A shows a plot of the calculated optical modes in an individual laser cavity (upper curve) and the injection efficiency though the half racetrack structure (lower curve).

The light source or system may favour longitudinal modes of the individual quantum cascade laser (QCL) cavity that gain maximum external injection. FIG. 11A shows a plot of the calculated optical modes in an individual laser cavity (upper curve 1174) and the injection efficiency through the half racetrack structure (lower curve 1175), obtained by three-dimensional (3D) full-wave simulations. The longitudinal modes that coincide with the peaks of the injection efficiency may be excited. This mechanism may determine the mode spacing of the device or light source. It may be observed that the final mode spacing is not equal (96 GHz and 71 GHz), this may be due to the waveguide dispersion which may make the original peaks of the upper 1174 and lower 1175 curves not equally spaced.

Figure 11B:
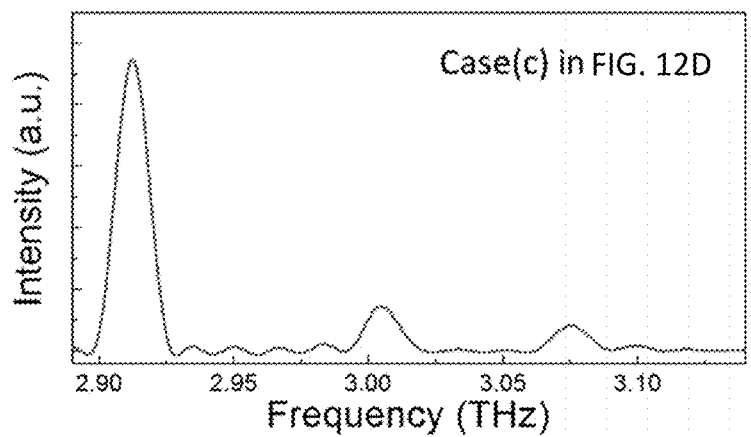
FIG. 11B shows a plot of the measured spectrum of a light source.

FIG. 11B shows a plot of the measured spectrum of a light source (which is shown also in FIG. 12D).

As shown, the calculation (upper and lower curves 1174, 1175 in FIG. 11A) and the experimental results (curve shown in FIG. 11B) match each other quite well, as may be observed from the positions of the peaks of the curve in FIG. 11B matching quite well with the three vertical (bold) lines shown in FIG. 11A.

Far-Field Investigation of the Phase-Locked Device or Light Source

The light source may operate at 10 Kelvin (K) under pulse excitation with 10 kHz, 500 ns electric pulses (light-current-voltage characteristics and spectra of the quantum cascade laser (QCL) are shown in FIGS. 7A and 7B). While not shown in FIGS. 7A and 7B, it should be appreciated that two-dimensional far-field emission patterns may be measured by scanning a pyroelectric detector on a spherical surface 15 cm away from an emission (output light (e.g., 504a) from the QCL area. The results are presented in FIGS. 12A to 12F below. The (0, 0) point in the far-field pattern corresponds to a direction normal to the light source (topview) surface (e.g., the light source wafer surface). Also shown are the calculated results obtained by a full-wave finite-difference time-domain (FDTD) method, which may reproduce the main features of the measured patterns.

FIGS. 12A to 12F show results of far-field investigation of a phase-locked light source (e.g., 500).

FIG. 12A shows the measured and simulated far-field patterns of the light source with only the left quantum cascade laser (QCL) (e.g., 502a) (pointed by arrow 1282 in FIG. 12A) pumped using a left injection current of $I_{left}$=3.49 A. A ~13°×9° (full-width-at-half-maximum (FWHM)) elliptical spot may be exhibited, and may be tilted in the orientation of the antennas.

FIG. 12B shows the measured and simulated far-field patterns with only the right quantum cascade laser (QCL) (e.g., 502b) and the half racetrack structure (e.g., 536) electrically pumped. The injection currents of the right QCL and the half racetrack structure are 3.67 A and 0.53 A, respectively. As frequency increases, the corresponding far-field pattern may shift upwards.

FIG. 12C shows the measured and simulated far-field patterns with the three parts (left quantum cascade laser (QCL) (e.g., 502a), right quantum cascade laser (QCL) (e.g., 502b) and the half racetrack structure (e.g., 536)) of the light source electrically pumped, where the injection currents are $I_{left}$=3.49 A, $I_{right}$=3.67 A and $I_{RT}$=0.53 A, respectively. The far-field pattern may appear similar to a superposition of the patterns of the left QCL and the right QCL individually. However, although the biasing conditions of each of the left QCL and the right QCL may be the same as that in FIGS. 12A and 12B, the far-field pattern in FIG. 12C is not simply the superposition of the far-field patterns shown in FIGS. 12A and 12B.

FIG. 12D show a laser spectra corresponding to FIGS. 12A, 12B, and 12C, respectively. The spectrum for FIG. 12C is not just the addition of the laser spectra corresponding to FIGS. 12A and 12B. Instead of having two peaks corresponding to the separate lasers (the left QCL and the right QCL in the cases of FIGS. 12A and 12B, the spectrum for the case of FIG. 12C has a main peak at a slightly lower frequency (FIG. 12D). This indicates that the left QCL and the right QCL may be phase-locked by the half racetrack structure, and their combined emission is coherent—the basis for demonstrating a polarization tunable light source. Pumping the laser with a higher current may give rise to extra emissions at a higher frequency; however, with the half racetrack active, the emission peaks in the spectrum may be reduced to a single peak (see spectrum illustrated for case (b) in FIG. 12D). This phenomenon may be understood as the Vernier effect in coupled cavities (please refer to FIGS. 11A and 11B).

To better understand the formation of the (output) beam (e.g., 504a), the near field distribution of the left quantum cascade laser (QCL) (e.g., 502a) was investigated. FIG. 12E shows the calculated near-field electric field distribution of the left QCL in a logarithmic scale; data are taken on a plane 2 μm above the antennas (e.g., 510). The antennas may direct (deflect) the surface plasmon (SP) wave (e.g., 454) towards a direction perpendicular to their length, as indicated by a white arrow 1280. This is because an electric dipole may radiate strongest along the perpendicular bisector of its length. In addition, it should be noted that without the dielectric-loaded surface plasmon (DLSP) waveguide and the antenna structure, the left QCL may emit fairly uniformly in the vertical direction with a divergence of ~180°, owing to the strong subwavelength mode confinement in the QCL (as the 10 -μm-thick active region is sandwiched by two metal plates, whilst the laser wavelength is ~100 μm). Therefore, the antenna structure may function as a highly efficient collimator, and the divergence of the emitted beam may be diffraction limited.

FIG. 12F shows an enlarged view of the measured far-field pattern in FIG. 12C, where a black dotted circle is illustrated to enclose the power collection region in the polarization measurements of FIGS. 12A to 12F. Note that except for FIG. 12E, all other diagrams are in linear scale.

To better understand the formation of the (output) beam (e.g., 504a), the near field distribution of the left quantum cascade laser (QCL) (e.g., 502a) was investigated. FIG. 12E shows the calculated near-field electric field distribution of the left QCL in a logarithmic scale; data are taken on a plane 2 μm above the antennas (e.g., 510). The antennas may direct (deflect) the surface plasmon (SP) wave (e.g., 454) towards a direction perpendicular to their length, as indicated by a white arrow 1280. This is because an electric dipole may radiate strongest along the perpendicular bisector of its length. In addition, it should be noted that without the GaAs-, or Si-, or InP-loaded surface plasmon (SP) waveguide and the antenna structure, the left QCL may emit fairly uniformly in the vertical direction with a divergence of ~180°, owing to the strong subwavelength mode confinement in the QCL (as the 10-μm-thick active region is sandwiched by two metal plates, whilst the laser wavelength is ~100μm). Therefore, the antenna structure may function as a highly efficient collimator, and the divergence of the emitted beam may be diffraction limited.

FIG. 12G shows distributed feedback (DFB) gratings 1283a incorporated on the top surface 1286 of the ridge segments 1285a, 1285b of the lasers 1203a, 1203b of the light source 1200a. The DFB gratings 1283a may also be formed at the tapering portions 1242a, 1242b. The DFB gratings 1283a may be in the form of (periodic) openings defined on or in the metal (e.g., 308a, FIG. 3A).

FIG. 12H shows distributed feedback (DFB) gratings 1283b incorporated at the sides of the ridge segments 1285c, 1285d of the lasers 1203c, 1203d of the light source 1200b. For example, the DFB gratings 1283b may include a plurality of (periodic) protrusions extending from opposite side surfaces of each of the ridge segments 1285c, 1285d.

It should be appreciated that various features or structures of the light sources 1200a, 1200b, and the operations thereof, may be as described herein in the context of the light sources (e.g., 200, FIG. 2; 500, FIG. 5A) of various embodiments.

Demonstration of Dynamically Tunable Polarization

Figure 13A:
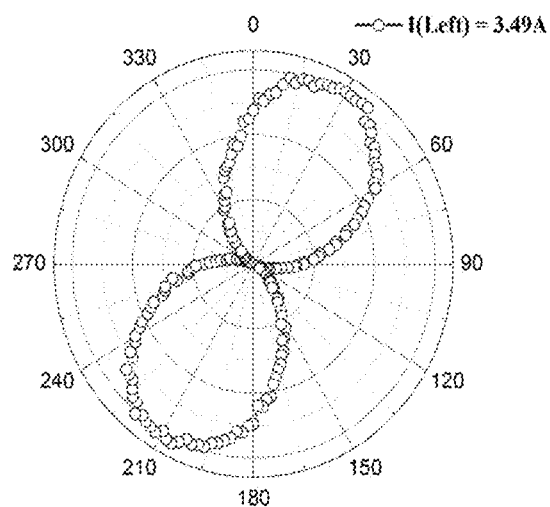
FIGS. 13A to 13D show results of detected power as a function of the rotation angle (α) of a polarizer in polar plots.
Figure 13B:
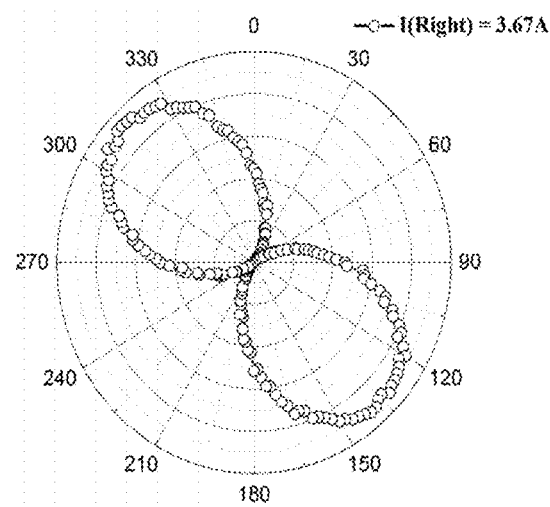

FIGS. 13A to 13D show results of detected power as a function of the rotation angle (α) of the polarizer in polar plots. α=0° corresponds to the direction along the laser ridge (e.g., 585, FIG. 5A), e.g., along its longitudinal axis. The polarization states of the emission may be measured by rotating the wire-grid polarizer in front of a detector, which may be placed at the intensity maximum of the far-field distribution. Optical power may be collected within a half angle of 2.5° (the region enclosed by a black dotted circle in FIG. 12F). The collected power may account for ~15% of the total emission. FIGS. 13A and 13B show the results with either the left quantum cascade laser (QCL) (e.g., 502a) and right QCL (e.g., 502b) biased, corresponding to the cases in FIGS. 12A and 12B, respectively. With only one laser on, the radiation in the collected region may be excellently linearly-polarized at a predetermined direction, which is consistent with that of the antenna and the far-field patterns. The high cross-polarization ratio may demonstrate the high efficacy of the antenna structure to project the polarization of a QCL onto a specific direction. When both lasers, together with the racetrack structure, are electrically pumped, however, elliptical polarization may be observed due to the coherent overlap of the two beams.

Figure 13C:
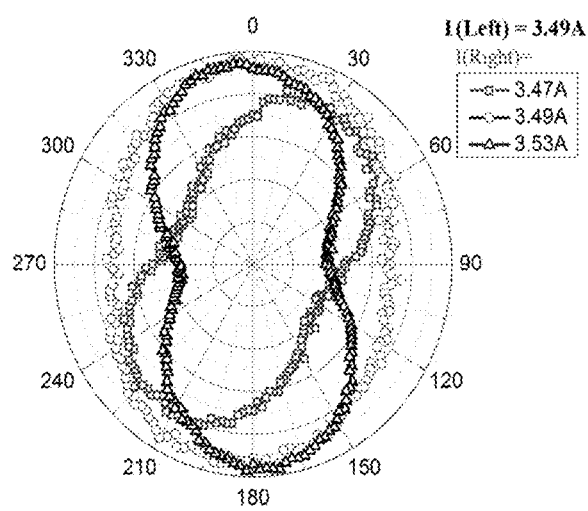
Figure 13D:
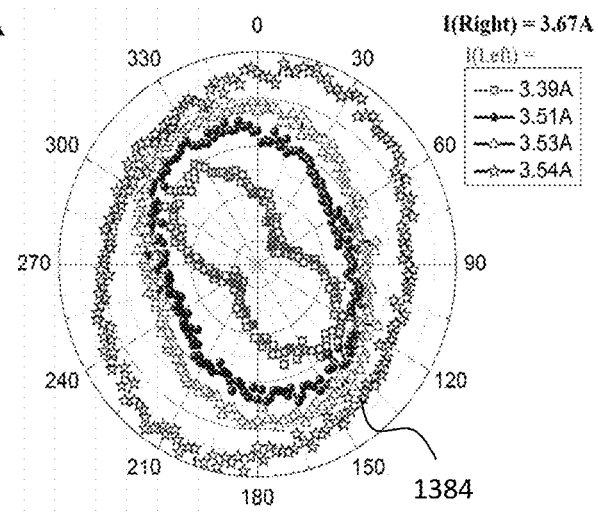

For the measurements in FIGS. 13C and 13D, the applied current to the half racetrack structure was kept at 0.53 A. The collected optical power for these measurements is within the central 5°×5° region, where the two beams are most well overlapped. FIG. 13C plots the polarization states with the current of the left quantum cascade laser (QCL) fixed at 3.49 A while the current in the right QCL was changed. FIG. 13D shows the evolution of the polarization state with the variation of the left pumping current of the left QCL while the right pumping current of the right QCL was fixed at 3.67 A. For the curve 1384 in FIG. 13D, $I_{max}:I_{min}$=56: 44 (where $I_{max}$ and $I_{min}$ mean the maximum and minimum of the light intensity, respectively, in the polarization measurement), and based on the definition of degree-of-circular-polarization (DOCP=$2 \cdot I_{max}^{1/2} \cdot I_{min}^{1/2}/(I_{max}+I_{min})$), a DOCP value as high as 99% may be obtained, illustrating that the light source of various embodiments may be capable of dynamically changing its polarization state (e.g., in the power collection region) from linear to near-circular.

Device or Light Source Without Phase Shift

In order to show that the terahertz (THz) beam in the power collection region is elliptically polarized, and not just an incoherent mix of two linearly-polarized beams, a light source without any phase shift between the two sets of antenna arrays may be fabricated. FIG. 14A shows an optical microscope image of part of a fabricated phase-locked light source 1400 without any phase shift. The light source 1400 may include a left and right quantum cascade lasers (QCLs) 1402a, 1402b. As may be observed in FIG. 14A, the two sets of antenna arrays 1410, 1412 are aligned to each other with no vertical shift. If the emitted radiation from the two antenna arrays 1410, 1412 are coherent, their overlap may result in a linearly polarized laser beam, but in a different direction from the emission from the separate arrays (see FIGS. 13A and 13B). FIG. 14B plots the measured polarization states of the light source 1400 of FIG. 14A, illustrating a variation of linear polarization, which is rotated by changing the currents in the two quantum cascade lasers (QCLs) (e.g., left QCL 1402a, right QCL 1402b) independently. For the right QCL alone, the radiation in the collected region is excellently linearly-polarized at the predetermined direction, with $I_{min}$≈0, whilst the left QCL shows a non-negligible $I_{min}$. The non-zero minimum intensity in the results from the left QCL alone may be attributed to a non-negligible direct emission from the QCL into the power collection region, which could arise from imperfection of the fabricated light source, resulting in a larger fraction of the light not being coupled into the surface plasmon (SP) wave. There may also be a contribution from undesired scattering of the SP wave by damage/dust on the waveguide surface. The current to the half racetrack structure was kept 0.53 A in these measurements.

The emitted radiation from the two antenna arrays mainly include three components: 1) the emission from the left antenna array defined by $A \cos(\omega t+\varphi)(\hat{x}+\hat{y})/\sqrt{2}$; 2) the direct emission/undesired scattering from the left quantum cascade laser (QCL) defined by $C \cos(\omega t)\hat{y}$; and 3) the emission from the right antenna array defined by $-B \cos(\omega t+\varphi)(-\hat{x}+\hat{y})/\sqrt{2}$, where A, B and C are electric field amplitudes, $\hat{x}$ and $\hat{y}$ are unit vectors, and φ is the phase difference between the radiation from the antenna arrays and that directly emitted from the laser facet. The measured intensity as a function of the polarizer angle α may be given by $$I(\alpha)=\tfrac{1}{2}A^2\cos^2(45°-\alpha)+\tfrac{1}{2}B^2\sin^2(45°-\alpha)+\tfrac{1}{2}C^2\cos^2(\alpha)-\tfrac{1}{2}AB\cos(2\alpha)+(AC\cos(45°-\alpha)-BC\sin(45°-\alpha))\cos(\alpha)\cos(\varphi).$$

The first three terms correspond to the direct contributions from the three components, and the last three terms are due to interference between these components. FIG. 14C plots the measured polarization states of the radiation from two antenna arrays (e.g., 1410, 1412). The solid curve 1491 in FIG. 14C is the fitting of the experimental data with the above equation. If the two quantum cascade lasers (QCLs) (e.g., left QCL 1402a, right QCL 1402b) are not phase-locked, the fourth and last term in the above to equation would vanish, meaning there is no interference between A and B, and between B and C. A and C may still have interference, though, as they both originate from the left QCL. The dashed curve 1493 in FIG. 14C represents the case without phase locking of the two QCLs. It deviates from the measured result (open triangles 1492) greatly. Put in another way, the open triangles 1492 are experimental data and the solid curve 1491 is a fitting according to coherent superimposition of the radiation from the two QCLs. The dashed line 1493 is the polarization assuming incoherent mixing of the radiation from the two antenna arrays.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A light source for operation in terahertz frequency region, the light source comprising:
 a coherent light generator arrangement configured to generate at least one output light; and
 a waveguide arrangement optically coupled to the coherent light generator arrangement, the waveguide arrangement comprising:
  a first surface portion and a second surface portion;
  at least one first resonator element and at least one second resonator element arranged in different orientations, each of the at least one first resonator element and the at least one second resonator element having an elongated shape,
  wherein the at least one first resonator element protrudes from the first surface portion and the at least one second resonator element protrudes from the second surface portion,
 wherein the waveguide arrangement is configured to interact with the at least one output light to cause the at least one first resonator element and the at least one second resonator element to emit respective first and second optical signals that are linearly polarized along respective longitudinal axes of the elongated shapes of the at least one first resonator element and the at least one second resonator element to co-operatively interact with each other to generate an output optical signal, and
 wherein the light source is configured to change a polarization characteristic of the output optical signal in response to at least one electrical signal applied to the light source to vary at least one of respective magnitudes of the first and second optical signals relative to each other.

2. The light source as claimed in claim 1, wherein the at least one first resonator element and the at least one second resonator element are arranged cross-oriented to one another.

3. The light source as claimed in claim 1, further comprising at least one phase shifter element capable of introducing a phase shift between the first optical signal and the second optical signal.

4. The light source as claimed in claim 1, wherein the polarization characteristic of the output optical signal comprises at least one of a polarization state or a polarization direction angle.

5. The light source as claimed in claim 1, wherein the coherent light generator arrangement comprises a grating structure.

6. The light source as claimed in claim 1, wherein the waveguide arrangement is configured to introduce a phase shift between the first and second optical signals.

7. The light source as claimed in claim 6, wherein the at least one first resonator element and the at least one second resonator element are arranged offset to one another to introduce the phase shift.

8. The light source as claimed in claim 1, wherein the coherent light generator arrangement further comprises at least one tapering portion arranged to optically couple the at least one output light to the waveguide arrangement.

9. The light source as claimed in claim 1,
 wherein the waveguide arrangement is configured to interact with the at least one output light to generate at least one surface wave, and
 wherein the at least one first resonator element and the at least one second resonator element are configured to interact with the at least one surface wave to emit the respective first and second optical signals.

10. The light source as claimed in claim 1,
 wherein the coherent light generator arrangement comprises an active region, and
 wherein the waveguide arrangement comprises a layer structure extending from the active region.

11. The light source as claimed in claim 10, wherein the active region comprises at least one of gallium arsenide, silicon, or indium phosphide.

12. The light source as claimed in claim 1,
 wherein the coherent light generator arrangement is configured to generate two output lights, and
 wherein the waveguide arrangement is configured to interact with one of the two output lights to cause the at least one first resonator element to emit the first optical signal, and further configured to interact with the other of the two output lights to cause the at least one second resonator element to emit the second optical signal.

13. The light source as claimed in claim 12,
 wherein the coherent light generator arrangement comprises: two resonating regions configured to generate the two output lights respectively; and
 an adjoining waveguide structure arranged to optically couple the two resonating regions to each other for phase locking the two output lights.

14. The light source as claimed in claim 13, wherein the waveguide arrangement comprises:
 a first waveguide structure optically coupled to one of the two resonating regions, the first waveguide structure comprising the at least one first resonator element; and a second waveguide structure optically coupled to the other of the two resonating regions, the second waveguide structure comprising the at least one second resonator element.

15. The light source as claimed in claim 1,
wherein the at least one first resonator element comprises a first upper metal portion spaced apart from the first surface portion, and
wherein the at least one second resonator element comprises a second upper metal portion spaced apart from the second surface portion.

16. The light source as claimed in claim 1, further comprising a beamsplitter optically coupled to the coherent light generator arrangement and the waveguide arrangement,
wherein the beamsplitter is arranged to split the at least one output light into a first output light portion and a second output light portion, and
wherein the waveguide arrangement is configured to interact with the first output light portion to cause the at least one first resonator element to emit the first optical signal, and further configured to interact with the second output light portion to cause the at least one second resonator element to emit the second optical signal.

17. A method for controlling a light source for operation in terahertz frequency region, the method comprising:
generating at least one output light from a coherent light generator arrangement of the light source for interaction with a waveguide arrangement of the light source to cause at least one first resonator element and at least one second resonator element of the waveguide arrangement having elongated shapes and arranged in different orientations to emit respective first and second optical signals that are linearly polarized along respective longitudinal axes of the elongated shapes of the at least one first resonator element and the at least one second resonator element to co-operatively interact with each other to generate an output optical signal, wherein the at least one first resonator element protrudes from a first surface portion of the waveguide arrangement and the at least one second resonator element protrudes from a second surface portion of the waveguide arrangement; and
applying at least one electrical signal to the light source to vary at least one of respective magnitudes of the first and second optical signals relative to each other to change a polarization characteristic of the output optical signal.

18. The method as claimed in claim 17,
wherein generating at least one output light comprises generating two output lights respectively from two resonating regions of the coherent light generator arrangement, the two resonating regions being optically coupled to each other by an adjoining waveguide structure for phase locking the two output lights, and
wherein applying at least one electrical signal to the light source comprises applying respective electrical signals of different magnitudes to the two resonating regions.

19. The method as claimed in claim 17, further comprising introducing a phase shift between the first optical signal and the second optical signal.

20. The light source as claimed in claim 15,
wherein the at least one first resonator element comprises a first material of gallium arsenide to support the first upper metal portion, the first material protruding from the first surface portion, and
wherein the at least one second resonator element comprises a second material of gallium arsenide to support the second upper metal portion, the second material protruding from the second surface portion.

* * * * *